United States Patent [19]
Tomasini et al.

[11] Patent Number: 5,990,748
[45] Date of Patent: Nov. 23, 1999

[54] FREQUENCY SELF-COMPENSATED OPERATIONAL AMPLIFIER

[75] Inventors: Luciano Tomasini, Monza; Rinaldo Castello, Arcore; Giancarlo Clerici, Vimodrone; Ivan Bietti, Casal Romano, all of Italy

[73] Assignee: SGS Thomson Microelectronics, S.r.l., Agrate Brianza, Italy

[21] Appl. No.: 09/129,288

[22] Filed: Aug. 5, 1998

Related U.S. Application Data

[63] Continuation of application No. 08/756,024, Nov. 26, 1996, Pat. No. 5,834,976.

[30] Foreign Application Priority Data

Nov. 30, 1995 [EP] European Pat. Off. .............. 95830497

[51] Int. Cl.[6] ................................. H03F 1/14; H03F 1/34
[52] U.S. Cl. ........................................... 330/292; 330/294
[58] Field of Search ................................... 330/260, 277, 330/292, 294, 311

[56] References Cited

U.S. PATENT DOCUMENTS

| | | | |
|---|---|---|---|
| 4,835,489 | 5/1989 | Monticelli | 330/277 |
| 5,140,279 | 8/1992 | Scott | 330/156 |
| 5,834,976 | 11/1998 | Tomasini et al. | 330/292 |

OTHER PUBLICATIONS

Journal of the Audio Engineering Society, vol. 30, No. 5, May 1982, NY, U.S., pp. 324–329, XP0002000333, E. Funasaka H. Kondou: "Feedforward Floating Power Supply (High–Response–speed Equalizer Circuit)."

Electronics Letter, vol. 26, No. 21, Oct. 11, 1990, Stevenage GB, pp. 1792–1794, XP000109643, C. A. Makris C. Toumazou: "Current–Mode Active Compensation Technques."

*Primary Examiner*—Steven J. Mottola
*Attorney, Agent, or Firm*—Jenkens & Gilchrist PC

[57] ABSTRACT

An operational amplifier frequency self-compensated with respect to closed-loop gain comprises a transconductance input stage and an amplifier output stage connected serially together to receive an input signal on at least one input terminal of the amplifier and generate an amplified signal on an output terminal of the amplifier. Provided between the input and output stages is an intermediate node which is connected to a compensation block to receive a frequency-variable compensation signal therefrom. The compensation block is coupled with its input to the input terminal of the amplifier. The compensation block is connected to receive at least the feedback signal. Preferably, the compensation signal is variable as a function of a gain value which is determined by the feedback circuit, and said variation of the compensation signal occurs in a relationship of inverse proportionality to the gain value.

12 Claims, 15 Drawing Sheets

FREQUENCY SELF-COMPENSATED OPERATIONAL AMPLIFIER

CROSS-REFERENCE TO RELATED APPLICATION

This application claims priority from European 95830497.4, filed Nov. 30, 1995, which is hereby incorporated by reference. This application is a continuation application of application Ser. No. 08/756,024, filed Nov. 26, 1996, which issued as U.S. Pat. No. 5,834,976 on Nov. 10, 1998.

BACKGROUND AND SUMMARY OF THE INVENTION

This invention relates to an operational amplifier which is frequency self-compensated with respect to closed-loop gain.

The operational amplifier of the preferred embodiment comprises a transconductance input stage and an amplifier output stage connected serially with each other to receive an input signal on at least one input terminal of the amplifier and generate an amplified signal on an output terminal of the amplifier. Also, an intermediate node is provided between the input and output stages which is connected to a compensation block to receive a frequency-variable compensation signal therefrom.

Reference is made, herein, by way of example and not of limitation, to non-predetermined gain systems wherein the integrated operational amplifier is either part of a single monolithically integrated device or, in a preferred embodiment, a separate circuit element.

As is well known, operational amplifiers are circuit elements of fundamental importance to electronic circuits, and are widely used in a variety of applications.

The most common construction of an operational amplifier basically comprises two serially connected stages, namely a transconductance input stage and an amplifier output stage.

Many applications involve the provision of an external feedback circuit which couples at least one output of the amplifier to an input thereof. Diagrams for a feedback operational amplifier, respectively in inverting and non-inverting configurations, are shown in FIG. 1a and 1b. The operational amplifier is schematically indicated at 1 and has an inverting input terminal IN− and a non-inverting input terminal IN+. In both figures, an output terminal OUT is feedback-connected to the inverting input terminal IN− by a feedback network, schematically represented by a resistor Rf. An input resistor Ri is connected to the inverting input IN−. A voltage signal Vs is input between a signal input IN of the fed-back amplifier and a ground line GND. The sign of the input voltage is in both cases inverted such that, in the inverting configuration, the input signal will be applied to the inverting input IN−, whereas in the non-inverting configuration, it will be applied to the other input IN+. The input voltage actually present across the two inputs of the amplifier is denoted by Vi, and the optionally amplified, output voltage present across the output OUT and the ground line GND is denoted by Vo. Also shown are an input current Ii and a feedback current If flowing through the resistor Rf.

A frequency-oriented analysis of the transfer function of the amplifier 1, that is of the mathematical law that governs the relationship between the input and output signals, enables the frequency-wise behavior and stability of the fed-back amplifier to be determined. For the purpose, it is necessary to consider the transfer function $G(s)$, where s is the complex variable. By transfer function, we mean here the modulo of the transfer function, for which the term gain or transfer ratio will be used as being more appropriate. With specific reference to FIGS. 1a and 1b, $Vo = -G(s)Vi$. Reference will be made hereinafter to open-loop transfer functions, that is having no external feedback, as denoted by $G_{ol}(s)$, and to closed-loop functions, as denoted by $G_{cl}(s)$.

In connection with the stability problems of fed-back circuits, it is generally necessary at the designing stage that attention be paid to possible problems of frequency response therefrom. The need for the fed-back amplifier to be a stable one, even at high frequencies and regardless of the external feedback, means in particular that an open-loop transfer function with suitably located poles and zeros must be provided.

It should be considered that the transfer function has a certain number of poles at certain frequencies, mainly due to the presence of capacitances. With an operational amplifier, these are primarily parasitic capacitances internal of the circuit and loads connected to the amplifier output.

The effects of a pole are, on the one side, a lowering circuit gain from its frequency value at a constant rate of decrease, and on the other side, the introduction of a phase shift, that is a phase change in the transfer function. Furthermore, an interaction with following poles enhances the effect on gain from the individual pole.

FIG. 2 shows, in deciBels and on a log scale, the open-loop gain pattern for an ideal operational amplifier as a function of the frequency f. Only the two main poles of the transfer function are shown for the amplifier, namely a first or dominant pole p1 at a low frequency f1 and a second or non-dominant pole p2 at a high frequency f2.

As can be seen, the non-dominant pole p2 locates here at gain values of less than one in modulo. A closed-loop configuration, that is the case of the feedback loop being closed, will be considered. With a closed-loop gain $G_{cl}$ of unity value, i.e. $G_{cl}=0dB$, the corresponding frequency defined by the intersection of the open-loop function $G_{ol}$ with the frequency axis, the so-called cutoff frequency, precedes the frequency f2 that corresponds to the non-dominant pole p2. If, as in the ideal case illustrated, the frequency f2 is sufficiently higher than the frequency $f_t$, the phase $\phi$ of the closed-loop transfer function is amply less than 180°. This ensures the stability of the fed-back system, in conformity with Bode's criterion for phase and gain.

However, open-loop transfer functions usually exhibit the behavior shown in FIG. 3, which is typical of an unstable fed-back system. Notice that the frequency f2, corresponding to the second pole, is in fact lower than the cutoff frequency $f_t$ of the open-loop gain function $G_{ol}$. Thus, the combined effects of the two poles resulting, after the second pole, in a doubled rate of gain decrease and combined phase shifts, are felt before the gain value $G_{ol}$ has dropped down to unity. Accordingly, the fed-back system with gain close to one has a limited phase margin from 180°.

The presence of further poles, not shown, at a higher frequency contributes toward making the fed-back amplifier even more unstable because the phase margin is still more restricted.

In the prior art, to obtain a desired pattern for the open-loop transfer function, effective to ensure the amplifier stability in the fed-back configuration, so-called compensation techniques have been used. These allow, in particular, the pole locations to be altered so as to bring the function profile close to that shown in FIG. 2.

A compensation circuit, commonly consisting of a compensation capacitor, is introduced for the purpose, which allows at least one of the main poles to be shifted in frequency so as to re-locate it. The publication "The Monolithic Op Amp: a Tutorial Study", IEEE Solid-State Circuits, Vol. SC-9, December 1974, pages 314–332 provides a detailed description of that technique, and is hereby incorporated by reference.

The compensation circuit may either be provided outside the device or, more frequently, inside the amplifier. Reference will specifically be made hereinafter to the latter option.

In general, a typical arrangement for compensating a fed-back operational amplifier by internal compensation may be that shown in FIG. 4. As previously mentioned, the amplifier comprises two blocks placed serially between an input terminal IN and an output terminal OUT: an input stage 2 and an output stage 3. Notice that, for simplicity, only the actual input and output terminals, respectively for receiving and generating the signal, have been shown in that figure. As shown in the figure, the blocks 2 and 3 provide amplifications −A1(f) and −A2(f), respectively, which are functions of the frequency f.

For the purpose of frequency compensation, the operational amplifier further includes a compensation block 4 connected between the output terminal OUT and a node S which lies intermediate the input stage 2 and the output stage 3. The block 4 is connected functionally to provide internal feedback, as explained herein below.

Assume, as shown in the figure, that the amplifier is fed back, that is that the output terminal OUT and input terminal IN of the operational amplifier are connected via a feedback circuit 5 outside the amplifier.

The amplifier receives an input signal, schematically illustrated by an arrow $S_{in}$, which is specifically applied to the input terminal IN, and supplies an output signal $S_{out}$ at its output terminal OUT. The external feedback circuit 5 receives that same output signal $S_{out}$ and generates a feedback signal Sf proportional to the output signal $S_{out}$, the proportionality factor being equal to the feedback factor $\beta_e(f)$, in turn tied to frequency, and is characteristic to the feedback circuit of choice. For example, where the feedback is simply provided by the resistor Rf, the factor $\beta_e(f)$ is determined by the split between Rf and the input resistor Ri. The feedback signal Sf is applied to the input terminal IN, represented in the figure by a summing node whereon the input signal $S_{in}$ and the feedback signal merge together. The compensation block also receives the output signal $S_{out}$, and generates a compensation signal Sc which is proportional to the former by an internal feedback factor $\beta_i(f)$ characteristic to the compensation block 4. The compensation signal Sc is supplied to the intermediate node S constituting a further summing node for a signal, denoted by S1, from the input stage 2 and for the aforementioned compensation signal Sc.

Thus, the compensation block 4 produces an internal feedback of sort which is only determined by the amplifier output signal and is always present in the standard case.

As previously mentioned, the compensation feature consists in practice of a capacitive element, typically a capacitor having a capacitance in the range: of a few pF to a few tens of pF, when internal, and of about 100 pF when external. This capacitor is adapted to control the value of the dominant pole, and possibly of the following poles in certain circuit configurations of the amplifier. Basically, the compensation capacitor connected to the intermediate node between the input and output stages will vary the actual capacitance as seen from the aforementioned node, which is material to the determination of the main pole locations.

Among the most widely used compensation techniques are the so-called dominant pole one, which provide for a downward shift of one pole to make it dominant, thereby allowing the gain to attain a unity value while the other poles are still ineffective, and the pole splitting techniques which utilize Miller's Effect.

In the examples which follow, the pole splitting technique will be taken into consideration. The effect of this technique on the transfer function is indeed one of splitting, that is of moving the poles, specifically the two main poles, away from each other. This behavior is illustrated diagrammatically by FIG. 5. The poles p1' and p2' of the compensated amplifier, whose frequencies are denoted by f1' and f2', are shifted from the poles p1 and p2 of the uncompensated amplifier which correspond to the frequencies f1 and f2. In particular, the pole p1 is shifted to the pole p1', at a low dominant frequency f1'<f1. The pole p2 is shifted to the pole p2', at a high frequency f2'>f2.

With the compensated dominant pole at a lower frequency than the uncompensated one, the gain begins to drop at an earlier time, so that the gain function will attain unity value more rapidly. This, when added to the fact that the compensated non-dominant pole is shifted in the opposite direction from that of the dominant pole, ensures that the non-dominant pole is at a frequency exceeding the cutoff frequency $f_t$ by a sufficient margin. Thus, upon compensation, the transfer function will be a similar pattern to that shown in FIG. 2.

Known in the art are several embodiments of frequency-compensated operational amplifiers using a variety of technologies of both the MOS type, such as CMOS, NMOS or PMOS, and the bipolar type.

Shown in FIG. 6 is a first embodiment with CMOS technology of an operational amplifier having a traditional compensation wherein a compensation technique known as Miller's Compensation is used.

The operational amplifier comprises a NMOS output transistor, shown at $Tg_{mo}$, having drain and source terminals respectively connected to the output terminal OUT of the amplifier and to ground GND. A current flow is forced through the transistor $Tg_{mo}$ by a current generator $I_{po}$ being connected to its drain terminal and powered from a supply terminal which is held at a constant voltage Vdd. The transistor $Tg_{mo}$ forms substantially the output stage 3 of the amplifier.

A gate terminal of the transistor $Tg_{mo}$ is connected, through an intermediate node S, to an output of a transconductance block 6 having a transconductance value $g_{mi}$. This block also has first and second inputs, designated "+" and "−", which are respectively connected to the input terminals IN− and IN+ of the amplifier. The input stage 2 of the amplifier basically consists of the transconductance block 6 and the resistor ri connected to an output of the block 6 for which it forms the output resistance.

In accordance with prior art techniques, the compensation capacitor, denoted by $C_C$ in the figure, is connected between the gate and the drain of the output transistor $Tg_{mo}$, that is between the intermediate node S and the output terminal OUT. This compensation capacitor $C_C$ forms the compensation block 4 of the amplifier.

The voltages Vi and Vo in the figure, which are respectively present across the input terminals IN− and IN+ and across the output terminal OUT and ground, represent the input voltage and the output voltage, respectively.

The compensation capacitor $C_C$ according to that prior art is, therefore, charged from the output. The voltage across it is equal, in fact, to the output voltage Vo, but for the gate-source voltage Vgs of the transistor $Tg_{mo}$.

The capacitances $C_P$, $C_L$ and $C_C$, where $C_L$ and $C_P$ respectively are the load capacitance connected to the output terminal OUT and the parasitic capacitance present on the gate terminal of $Tg_{mo}$, determine the locations of the poles and zeros of the open-loop transfer function of the compensated amplifier.

A calculation based on the equivalent circuit for small signals yields the main poles of the compensated amplifier of FIG. 6. These are identified, with due approximation, by the following relations:

$$p1'(M)=-1/(g_{mo}r_i r_o C_C) \text{ and}$$

$$p2'(M)=-g_{mo}*K_M/(C_P+C_L) \text{ with } K_M=C_C/(C_P+C_C)$$

where, $g_{mo}$ is the transconductance of the transistor $Tg_{mo}$, and $r_o$ is the output resistance of the simplifier. By comparing to the poles of the uncompensated amplifier, a splitting effect of the kind shown in FIG. 5 can be noticed. Lacking compensation, the main poles are expressed, in fact, by $p1=-1/r_i C_P$ and $p2=-1/r_o C_L$. The shift in the respective frequencies to be obtained from $-2\pi/p$ is readily verified.

The provision of the compensation capacitor $C_C$ also introduces a zero $z(M)=g_{mo}/C_C$. This can be eliminated, however, by connecting in series with the compensation capacitor $C_C$ a compensation resistor with a value of $1/g_{mo}$.

A modification of the circuit in FIG. 6 provides, in order to eliminate the zero, for the introduction of a buffer or voltage follower consisting, for example, of a transistor connected in series with a current generator between the compensation capacitor and the output of the operational amplifier. In this way, the capacitor will have no undesired effects on the output voltage. The dominant pole is found from the same relation as in the previous case, whereas the non-dominant pole takes the form $p2'(Mb)=-g_{mo}C_C/(C_P+C_C)C_L$.

A further compensation technique has been developed by Bhupendra Ahuja, and is described in detail, for example, in an article entitled "An improved frequency compensation technique for CMOS operational amplifiers", published in IEEE J. Solid-State Circuits, vol. SC-18, No. 6, December 1983, pages 629–633, which is hereby incorporated by reference.

An embodiment based on Ahuja's compensation principle is shown in FIG. 7. This embodiment is similar to that of FIG. 6, except that the compensation block 4 is here a more complicated design. Besides the compensation capacitor $C_C$, in fact, an additional transistor TB and a pair of current generators $I_{PI}$ are provided.

The additional transistor TB is of the PMOS type and has a drain terminal connected to the intermediate node S, that is to the gate of $Tg_{mo}$, as well as to a generator $I_{PI}$, and a source terminal connected to the other generator $I_{PI}$. Thus, a constant current is forced through TB. A gate terminal of TB is held at the constant potential VB.

The compensation capacitor $C_C$ has a terminal coupled to the node S through the additional transistor TB, and precisely, directly connected to the source terminal of the transistor TB. The voltage at this terminal of $C_C$ is, in this case, held substantially constant, equal in particular to the value of VB which, as mentioned, is fixed but for the gate-source voltage Vgs of the transistor TB. In a similar way to the circuit based on Miller's principle, the other terminal of $C_C$ is connected to the drain of $Tg_{mo}$, that is to the output terminal OUT.

In calculating the characteristic quantities of the transfer function of the open-loop amplifier for this type of compensation, it should be considered that, to determine the non-dominant pole, the actual transconductance as seen from the output end is multiplied by a factor $K_A=C_C/C_P$ given by the particular circuit configuration. The following poles are obtained:

$$p1'(A)=-1/(g_{mo}r_i r_o C_C) \text{ and}$$

$$p2'(A)=-g_{mo}K_A/(C_C+C_L).$$

Whereas the dominant pole is left unaltered, the non-dominant pole is shifted toward higher frequencies. Thus, the operational stability range is expanded frequency-wise compared to the previous case, for a compensation capacitor of the same value.

An operational amplifier compensated by conventional techniques of the kind just described has, however, certain drawbacks. Consider applications wherein the amplifier is to operate with different feedbacks, or wherein the closed-loop gain is not predetermined univocally, due to fluctuations in the working parameters during its operation. Take, for example, the instance of electrical systems having discrete elements, wherein the operational amplifier forms a circuit by itself, useful in applications of the audio or telephone type where the feedback can be selected by the user. Also, in a fully integrated device, let us consider the utilization of so-called variable-gain operational amplifiers.

Once the amplifier is designed and fabricated with preset compensation, and therefore, with the open-loop transfer function of the amplifier predetermined, the choice of the fed-back amplifier gain, or closed-loop gain, as determined by the external feedback and essentially by the resistance value applied in the feedback loop as previously explained, is restricted to a relatively narrow range of values.

It should be borne in mind, in this respect, that in the design of fed-back operational amplifiers, special care is taken to maximize the width of the frequency band wherein the amplifier will operate properly and be stable. The selection of certain closed-loop gain values clashes with the requirements for stability and a wide frequency response of the amplifier.

To make this concept more easily understood, two discrete values of closed-loop gain for an amplifier having a predetermined compensation have been shown in FIG. 8a. In FIG. 8b, the same gain values are shown for an amplifier having no compensation or having reduced compensation with respect to the other figure. The numerical gain values are denoted by G1 and G2, with G1>G2 and G2 close to one. The respective frequencies at which the open-loop gain function is cut off are referenced f1a and f2a in FIG. 8a, and f1b and f2b in FIG. 8b. Also shown at f1', f2' and f1, f2 are the frequencies of the main poles.

Where the feedback determines gain values G2 close to one, such as where the fed-back amplifier is configured as a follower, only the compensated amplifier is stable. To have matters better understood, the gain axis should be visualized as shifted to the gain value G2. The frequencies f2a and f2b would then become the cutoff frequencies. Since the frequency f2a precedes the frequency f2' of the non-dominant pole, i.e. $f2a=f_t<f2'$, the compensated amplifier will be stable, as explained hereinabove. The frequency f2b lies instead above the cutoff frequency, i.e. $f2b=f_t>f2$, with attendant loss of stability for the uncompensated amplifier.

On the other hand, where a particular application requires a high gain, this adversely affects, the width of frequency response. As can be gathered from a comparison of the two figures, for a gain of G1, the width of the response frequency band is too narrow at the higher frequencies, where compensation is used, and is wider for an amplifier with little compensation. It can be seen, in fact, that f1a is significantly less than f1b.

Thus, depending on the particular compensation applied, for a particular choice of gain, one can incur stability problems, on the one side, and excessive constraint on the band and consequent loss of speed, on the other.

This problem is obviated in discrete element systems by using an external compensation capacitor which can be plugged in by the user according to the closed-loop gain value selected.

One underlying technical problem addressed by this application is to provide an operational amplifier which is frequency self-compensated according to the closed-loop gain present in a particular application at a particular time. The compensation value should be controlled automatically, without control from the user, for optimum performance in terms of speed of response and stability of the fed-back amplifier at any gain values.

In particular, an object of this invention is to provide a fed-back operational amplifier which is uniquely versatile, and can be connected in a variety of systems, such as programmable systems, by the user.

The idea underlying the preferred embodiment is that of providing an operational amplifier which includes a compensation capacitor, wherein the voltage across the capacitor is varied according to the feedback applied thereto, and hence to the closed-loop gain. For the purpose, one end of the capacitor is connected to receive a signal generated by the external feedback.

An operational amplifier frequency self-compensated with respect to closed-loop gain, preferably an integrated one, comprises a transconductance input stage and an amplifier output stage connected serially together to receive an input signal on at least one input terminal of the amplifier and generate an amplified signal on an output terminal of the amplifier. Provided between the input and output stages is an intermediate node which is connected to a compensation block to receive a frequency-variable compensation signal therefrom.

According to the preferred embodiment, the compensation block is input coupled to the input terminal of the amplifier. In essence, for frequency compensation, the output terminal is connected to the input terminal of the amplifier by a feedback network including a negative feedback circuit which generates a feedback signal. In the instance of an inverting feedback, the compensation block is downstream connected to the input terminal with respect to the input signal, so as to receive both the input signal and the feedback signal. Where the feedback is non-inverting, the compensation block is connected before the input terminal, toward the feedback network, so as to only receive the feedback signal, not the input signal.

The compensation signal generated by the compensation block is variable according to a gain value which is determined by the feedback circuit, and the compensation signal variation occurs in a relationship of inverse proportionality with the gain value.

In practical embodiments, the compensation block includes at least one storage element, specifically a compensation capacitor having a terminal coupled to the input terminal of the amplifier.

The invention is useful with conventional compensation techniques. In particular, in a preferred embodiment of the invention, the operational amplifier includes a compensation of the Ahuja type, and is preferably connected in a non-inverting configuration.

This invention can be applied to systems wherein gain is neither predetermined nor predeterminable. The disclosed amplifier is also useful where the gain value varies with time. Another example where the load applied to the output of the amplifier is particularly variable in frequency with attendant instability of the operational parameters.

The technical problem is solved by an operational amplifier frequency self-compensated with respect to closed-loop gain, of the type described above and defined in the claims.

This problem is also solved by a method for frequency compensating adaptively an operational amplifier with respect to closed-loop gain, as defined in the claims.

The features and advantages of an operational amplifier according to this invention will be apparent from the description of embodiments thereof given by way of example and not of limitation with reference to the accompanying drawings.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 9A:
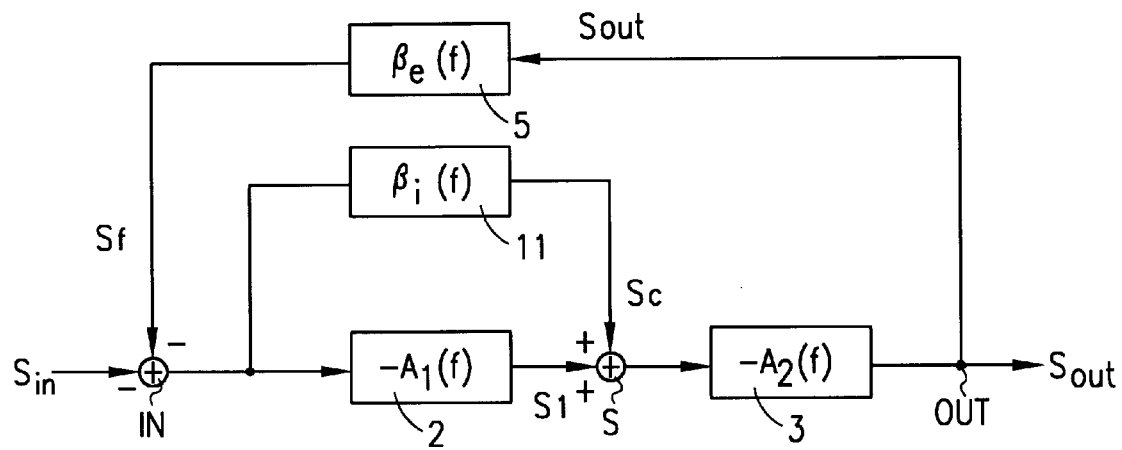
FIGS. 9a and 9b are functional block diagrams of a fed-back operational amplifier, frequency self-compensated in accordance with this invention, in the inverting and non-inverting configurations, respectively.
Figure 9B:
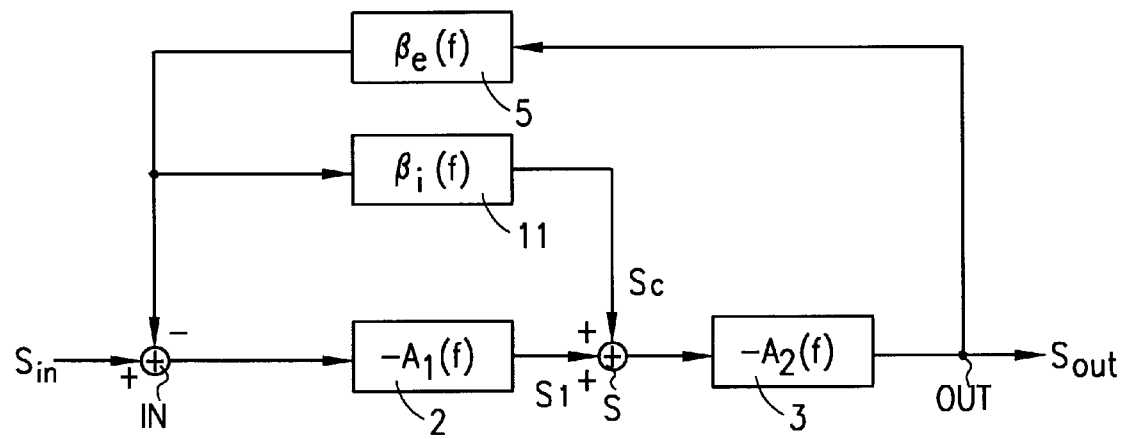

The numerous innovative teachings of the present application will be described with particular reference to the presently preferred embodiment (by way of example, and not of limitation), in which:

An operational amplifier according to the preferred embodiment is illustrated by FIGS. 9a and 9b. These figures show functional block diagrams of an operational amplifier with feedback, respectively in an inverting and a non-inverting configuration thereof. Corresponding blocks and elements are denoted by the same references as used in the previous figures relating to the prior art. Preferably, the operational amplifier is monolithically integrated.

In both figures the amplifier is shown to comprise, similar to the conventional construction previously discussed, a transconductance input stage 2 and an amplifier output stage 3, connected serially with each other between at least one input terminal IN and an output terminal OUT. Preferably, the input stage 2 is a differential type comprising a differential pair of input transistors, for example. The amplification factor $-A1(t)$ shown indicates how much, as a frequency function, the signal applied to its input is amplified at the output by the input stage 2 itself. The output stage 3 is a gain stage having an amplification factor of $-A2(f)$ and, preferably, an active gain element, such as a transistor, as explained hereinafter.

The input stage 2 is arranged to receive an input signal $S_{in}$ which is applied to the terminal IN. The signal $S_{in}$ commonly is either a voltage or a current signal. An output signal $S_{out}$ is output by the output stage 3 over the terminal OUT. The last-mentioned signal is proportional to $S_{in}$ by a factor which is basically tied to the amplification factors A1 and A2.

A node S is intermediate the input 2 and output 3 stages and connected to a compensation block 11 which is also internal to the operational circuit for closed-loop frequency compensation. For the purpose, the node S receives a frequency compensation signal Sc from the compensation block 11.

According to the preferred embodiment, the compensation block 11 has an input coupled to the input terminal IN of the amplifier, rather than to the output terminal OUT as in the prior art.

To explain how this structure affects performance, the operational amplifier must be fed back. For the purpose, FIGS. 9a and 9b show a feedback network which includes a feedback circuit, generally and schematically represented by a block 5, connected between the output terminal OUT and the input terminal IN. As previously explained, the feedback is normally provided by one or more feedback resistors Rf. In FIG. 9a, the block 5 represents a feedback of the inverting type, and a non-inverting feedback in FIG. 9b. The feedback circuit receives the output signal Sout and supplies a feedback signal Sf to the input terminal IN which is proportional to $S_{out}$ by the feedback factor $\beta_e(f)$ characteristic to the feedback circuit.

According to the preferred embodiment, with the output terminal of the amplifier connected to the input terminal through the feedback circuit 5, the compensation block 11 is operatively connected to receive at least the feedback signal Sf.

The overall operation of the fed-back amplifier is determined, as in the prior art, by a double feedback network of sort. The behavior of the feedback operational amplifier according to the preferred embodiment will now be described.

In operation, the output signal $S_{out}$ from the output stage 3 is also supplied to the feedback circuit 5, outside the amplifier, which will then generate the feedback signal Sf. The latter is applied, together with the input signal $S_{in}$, to the input terminal IN forming a summing node. Both signals are input to the transconductance input stage 2 to trigger on the main feedback cycle. This operation holds for both circuits of FIGS. 9a and 9b.

For a full appreciation of the operation of the compensation block 11, which is differently coupled to the input terminal IN in the two cases shown, the structure of the feedback network should first be reviewed. In the inverting configuration, both the input $S_{in}$ and feedback Sf signals are applied to the inverting terminal. On the other hand, in the non-inverting configuration, the inverting terminal only receives the feedback signal Sf, the input signal $S_{in}$ being supplied to the non-inverting terminal.

Referring to FIG. 9a, it is assumed an inverting configuration for the operational amplifier: then, the compensation block 11 will be downstream connected, to provide frequency compensation, to the input terminal IN with respect to the signal $S_{in}$. That is, the compensation block will be input both the input $S_{in}$ and feedback Sf signals.

The compensation block outputs a compensation signal Sc which is proportional by a factor $\beta_i(f)$ to the combined input signals. On the intermediate node S, which acts as an adder, the compensation signal Sc and a signal S1 from the input stage 2 merge together.

With the non-inverting feedback, as shown in FIG. 9b, the compensation block 11 is connected before the input terminal IN, toward the external feedback network. Unlike the inverting case, in the non-inverting configuration, only the feedback signal Sf from the feedback circuit 5 is input to the compensation block 11. The input signal $S_{in}$ is only supplied to the input stage 2.

In either cases, the internal feedback network, basically consisting of the compensation block 11, forms a second feedback network, inside the amplifier, which establishes an "inverse feedback" of sort with respect to the feedback circuit 5.

The compensation block 11 functions to alter the open-loop transfer function, specifically to shift its poles, as brought out by embodiments thereof, in order to ensure stable operation of the amplifier. According to the preferred embodiment, this compensation is controlled, automatically and directly, by the extent of the external feedback, and hence by the closed-loop gain values.

According to the preferred embodiment, the compensation block 11 preferably includes in practice, as explained hereinafter, at least one charge storage element having a terminal coupled to the input terminal IN of the amplifier. In particular, the voltage across said storage element is tied to the gain $G_{cl}$ as determined by the feedback network.

This storage element comprises, according to preferred embodiments of this invention, a compensation capacitor whose value is preferably within the 2 to 10 pF range.

Circuit diagrams of an operational amplifier, generally denoted by 10, according to the preferred embodiment, will now be discussed with reference to FIGS. 10a and 11a, for comparison to conventional compensations of the pole-splitting type, already described. In the following figures, similar or equivalent elements carry the same reference numerals.

The following examples relate in particular to circuits made with MOS, preferably CMOS, technology. However, the amplifier 10 may equally be made using NMOS or PMOS technology, or a bipolar technology.

Figure 10A:
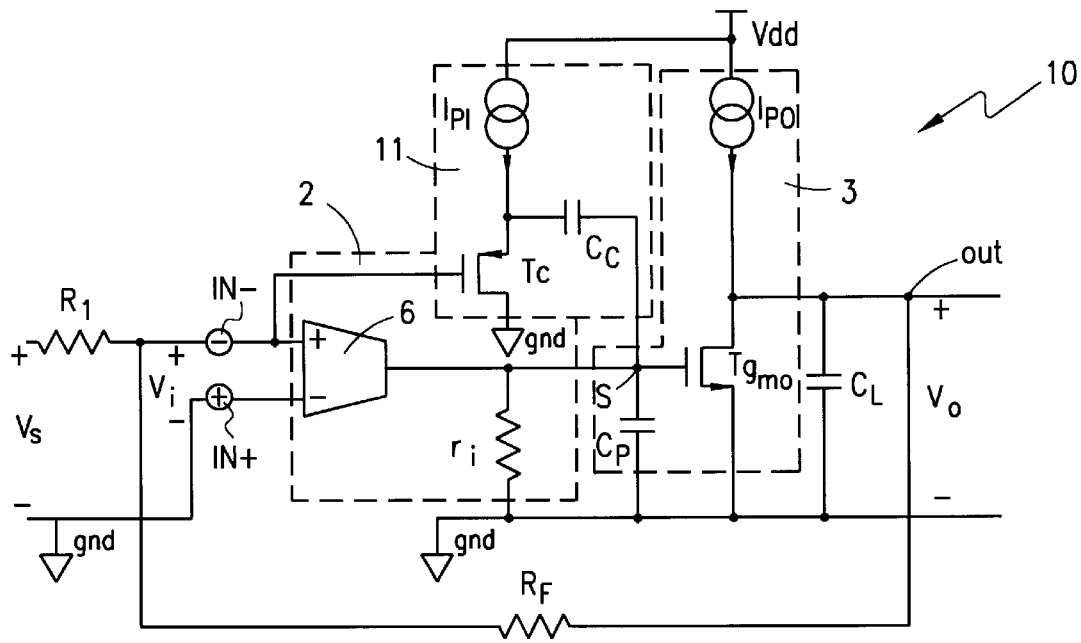
FIG. 10a shows a first embodiment of an operational amplifier according to the invention using Miller's compensation, including an external feedback.

FIG. 10*a* shows at first embodiment, providing compensation of the Miller type. Also shown in this figure is the external feedback, specifically in an inverting configuration, which comprises a resistor Rf and resistor Ri, for example.

Figure 1A:
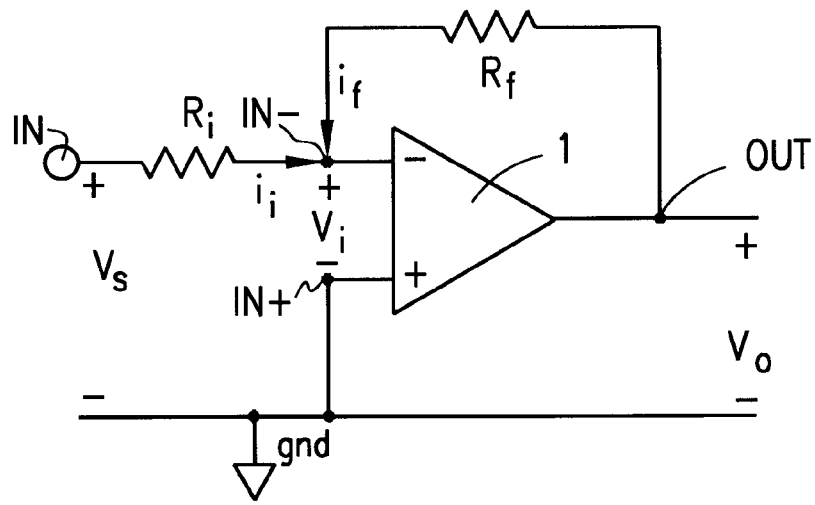
FIGS. 1a and 1b show general diagrams of a fed-back operational amplifier in inverting and non-inverting configurations, respectively.
Figure 1B:
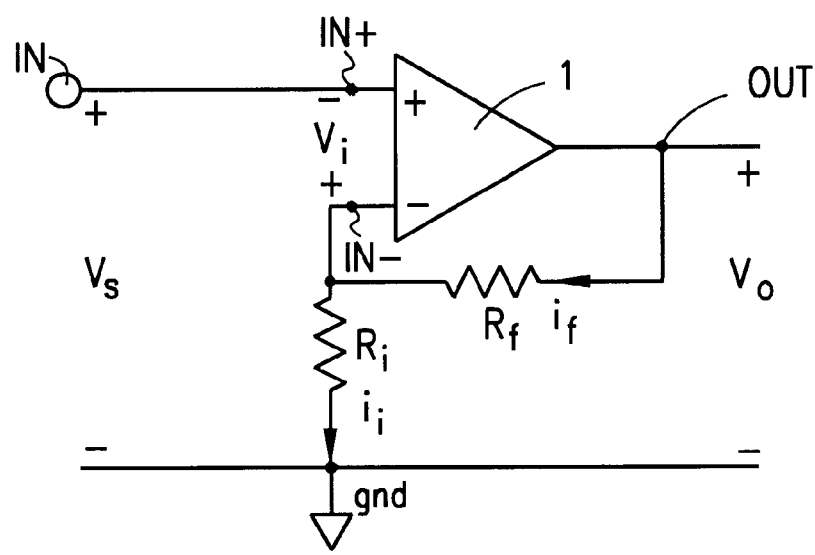
Figure 2:
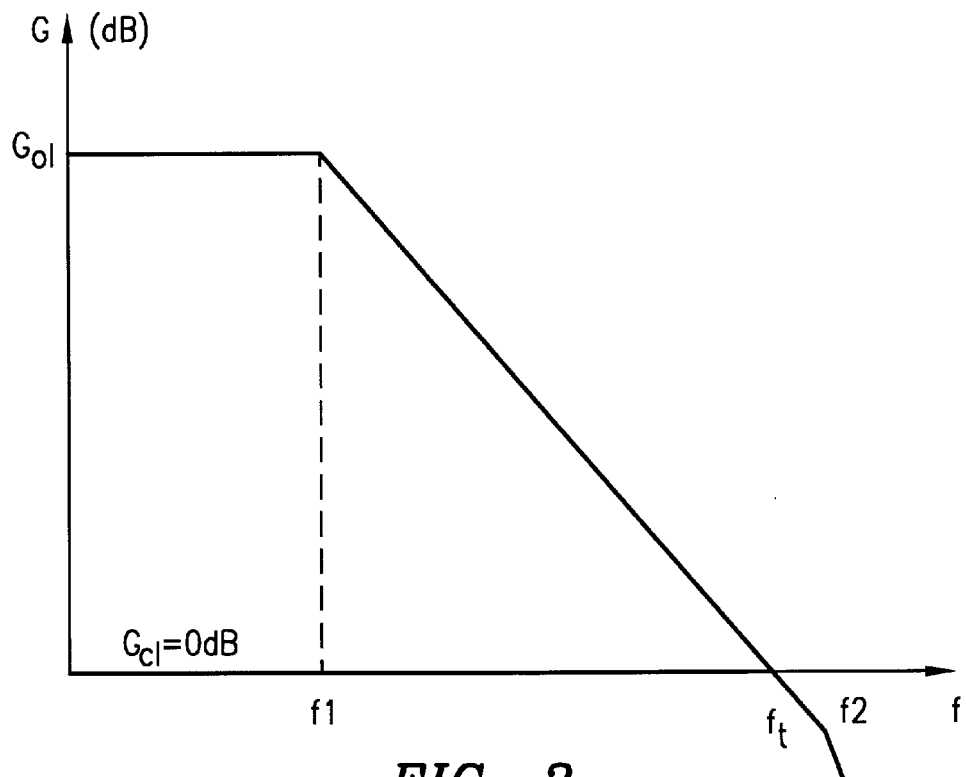
FIGS. 2 and 3 illustrate the open-loop gain function for a frequency-stable amplifier and an unstable amplifier with low gains at high frequencies, respectively.
Figure 3:
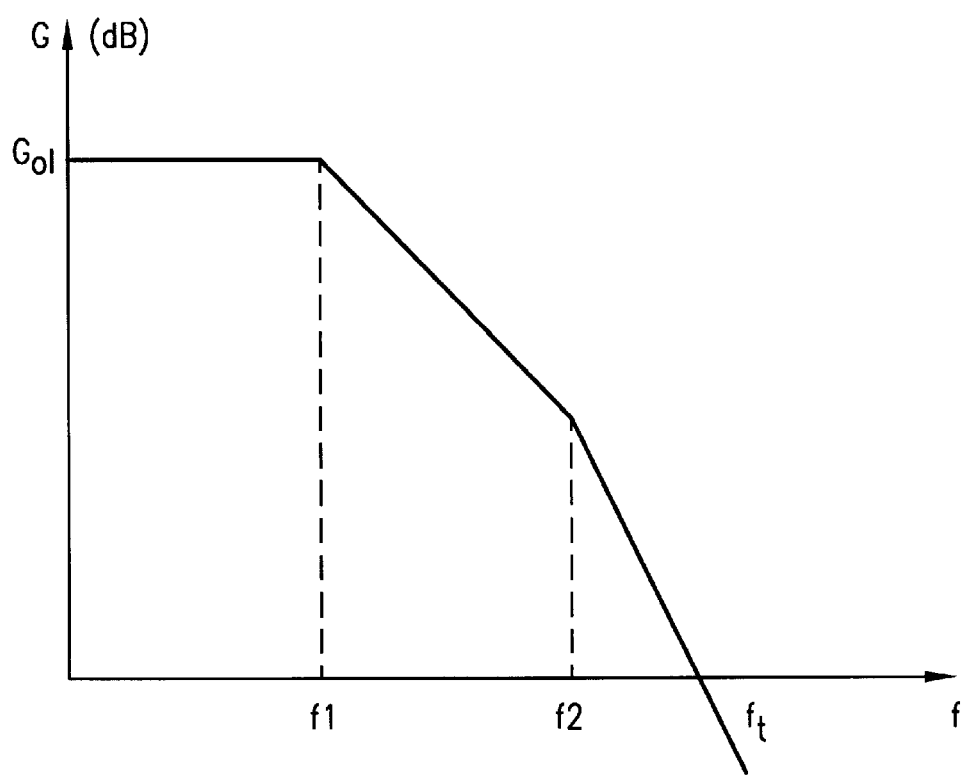
Figure 4:
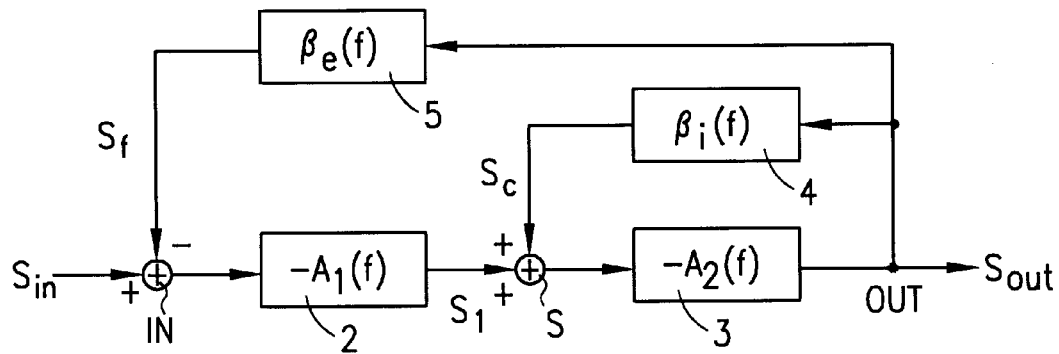
FIG. 4 is a functional block diagram of a frequency-compensated fed-back operational amplifier according to the prior art.
Figure 5:
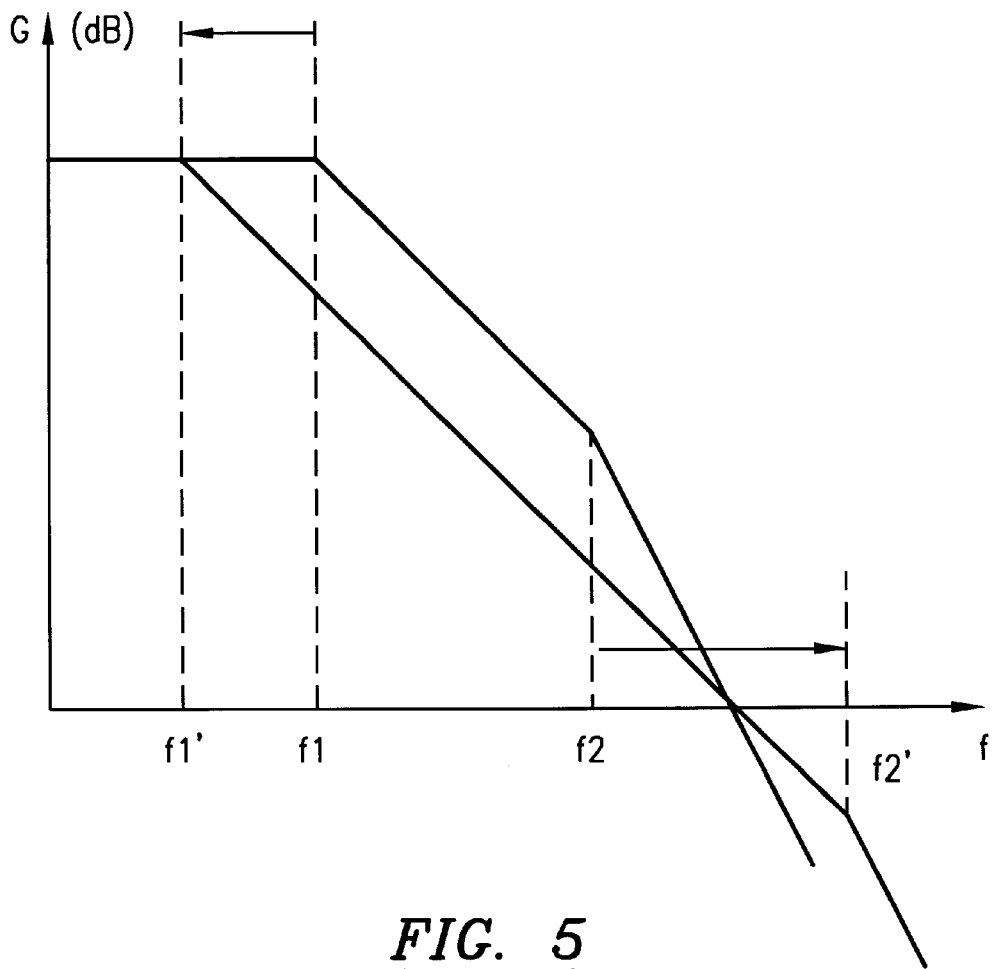
FIG. 5 shows the effect of compensation using a pole-splitting or Miller's technique on the gain function.
Figure 6:
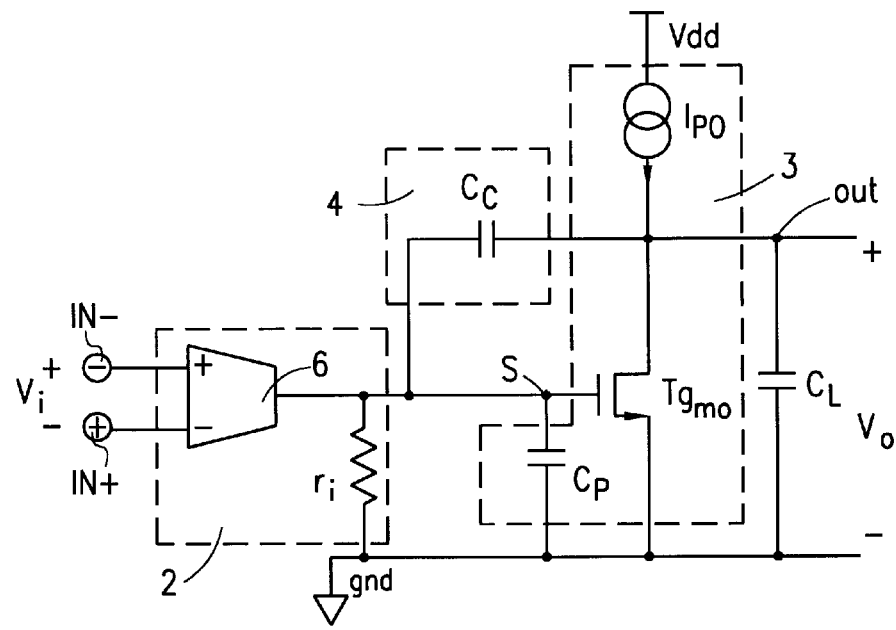
FIG. 6 shows an example of an operational amplifier with Miller's compensation according to the prior art.
Figure 7:
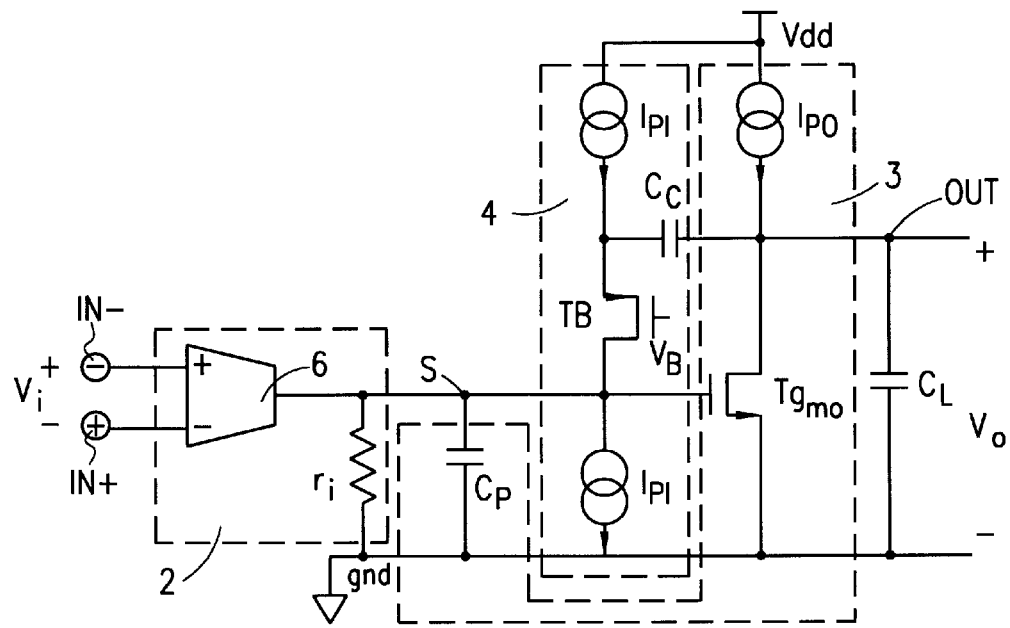
FIG. 7 is a circuit diagram of a further example of a conventional operational amplifier using Ahuja's compensation.
Figure 8A:
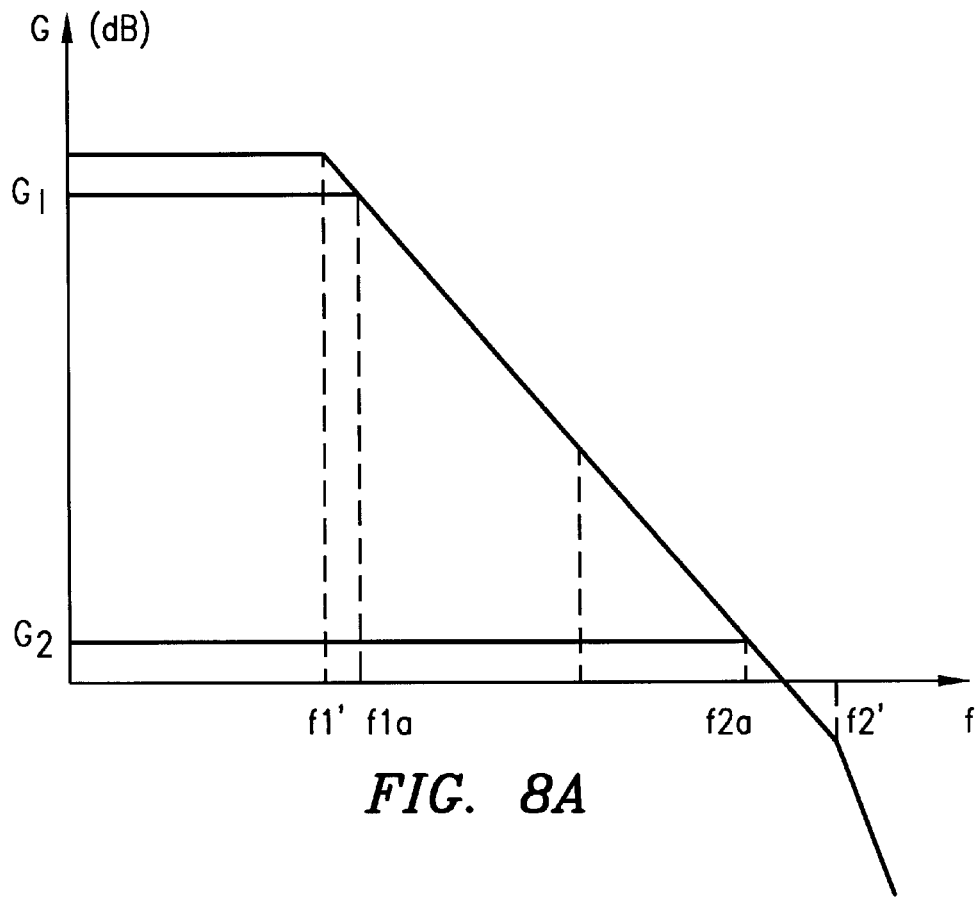
FIGS. 8a and 8b illustrate, in terms of closed-loop gain, the draw-backs of conventional operational amplifiers of the type already described in the foregoing, at two different compensation values.
Figure 8B:
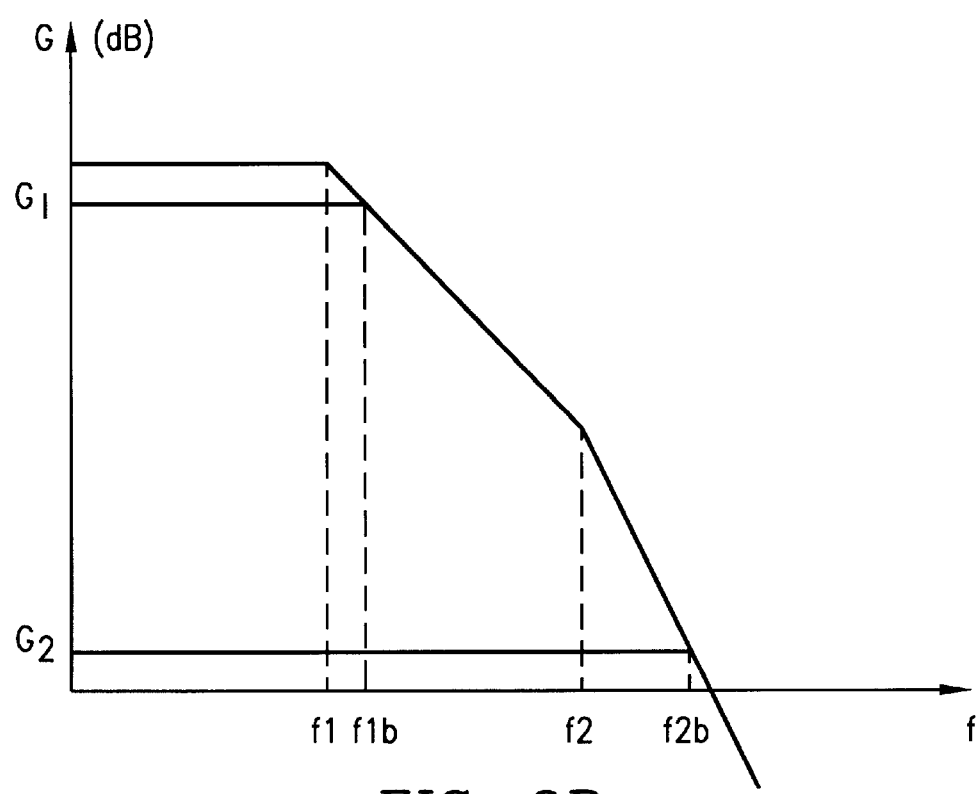

First and second input terminals IN− and IN+ represent inverting and non-inverting terminals of the amplifier, respectively. An output terminal is designated OUT. Like in FIG. 6, the amplifier 10 includes as input a transconductance block 6 having a transconductance $g_{mi}$, which forms the input stage 2, preferably of the differential type. The output stage 3 has on its output an output transistor $Tg_{mo}$ of the NMOS type.

The transconductance block 6 has a pair of input terminals "+" and "−" connected to the amplifier input terminals IN− and IN+, respectively, and an output terminal connected to the intermediate node S. Its equivalent output resistor, designated $r_i$, is shown connected to the output of the block 6. The output transistor $Tg_{mo}$ is connected in a common-source configuration with its source terminal to the ground terminal GND. Its drain terminal is connected directly to the output terminal OUT and to an output current generator $I_{PO}$ which forces a current flow through the transistor. The operation of the transistor $Tg_{mo}$ is controlled through a gate terminal connected to the intermediate node S, between the input stage 2 and the output stage 3. Of course, the output transistor $Tg_{mo}$ could be replaced with an equivalent active gain element serving the same amplification function.

The compensation block 11 substantially comprises a compensation capacitor $C_C$, in this first embodiment. A first terminal of the capacitor $C_C$ is connected, as in the prior art, directly to the gate of the output transistor $Tg_{mo}$, that is to the intermediate node S.

According to this embodiment, the compensation capacitor $C_C$ also has a second terminal coupled to the first input terminal IN1 of the amplifier 10, preferably via a transistor Tc of the PMOS type.

As shown in the figure, the transistor Tc is provided in a source-follower configuration. More particularly, the second terminal of the capacitor $C_C$ is connected to a first output terminal, in this case a source terminal, of the transistor Tc and to an input current generator $I_{PI}$. The transistor Tc also has a second output terminal, its drain terminal, held at a constant voltage, being in particular connected to the ground terminal GND. A control terminal, the gate terminal, is connected to the aforesaid first input IN− of the amplifier 10: thus, the driving is provided by the input signal. The current generator $I_{PI}$, being supplied the voltage Vdd, allows a current to be forced through the transistor Tc.

The transistor Tc functions to enable unidirectional coupling of the compensation capacitor to the input terminal IN− when it is applied the signal, thereby preventing the input from becoming charged by the capacitor. The second terminal of the compensation capacitor $C_C$ is at a voltage which differs from the voltage at the input terminal by a predetermined amount equal to the gate-to-source voltage drop Vgs of the transistor Tc. Preferably, the last-mentioned transistor has unity gain.

Also shown at $C_P$ in FIG. 10*a* is the parasitic capacitance which is inherently present at the gate terminal of $Tg_{mo}$, it resulting from the internal gate-source capacitance Cgs and gate-drain capacitance Cgd of the MOS transistor. A further capacitor $C_L$, connected across the output terminal OUT and the ground terminal GND, forms an external load which, as is known, can be represented diagrammatically by a series connection of a resistive load $r_L$, not shown, and a capacitive load $C_L$.

The fed-back operational amplifier shown in FIG. 10*a* operates in the following manner. The input voltage Vi is applied across the input terminals IN− and IN+, and therefore, across the input terminals "+" and "−" of the transconductance block 6. The latter outputs a current signal which is converted to a voltage across the resistor $r_i$, that is at the intermediate node S. The gate terminal of the output transistor $Tg_{mo}$ is applied the same voltage as the node S, and the current $I_{PO}$ can be forced therethrough. As at result, the transistor $Tg_{mo}$ will generate a signal Vo, which may be amplified with respect to the input signal Vi, to the output terminal OUT of the amplifier. The difference between the voltages Vo and Vi is then applied across the feedback resistor Rf connected between the output terminal OUT and the input terminal IN−, which will produce a feedback effect.

The frequency self-compensating effect according to this embodiment is provided by the compensation capacitor $C_C$. The voltage across this capacitor varies according to the signal present at the input terminal IN−, i.e. V(IN−). In fact, the second terminal of the aforesaid capacitor is at the voltage V(IN−) but for the gate-source voltage of the transistor Tc. However, the voltage V(IN−) is tied to the feedback, as well as to the input voltage Vi.

Figure 10B:
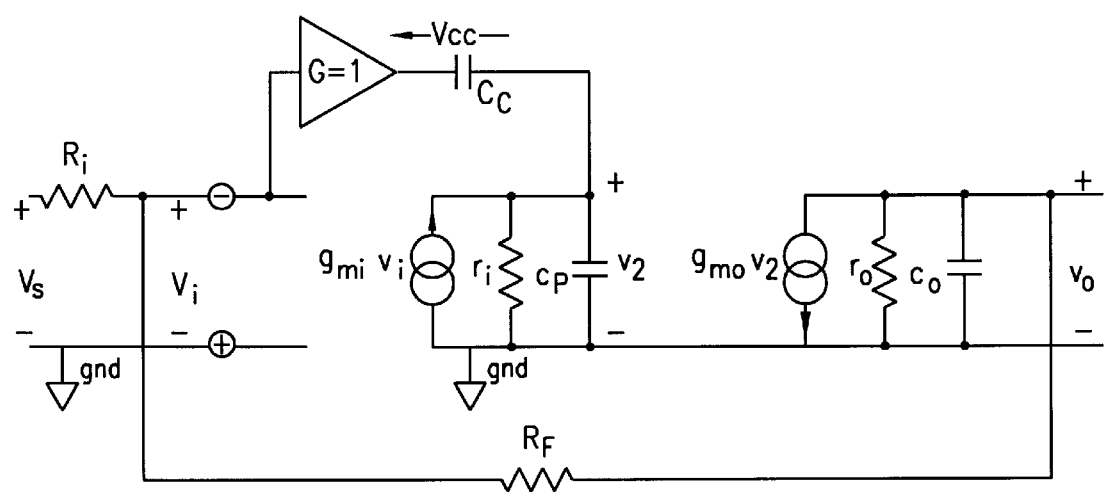
FIG. 10b shows its circuit for small signals.

The values of the poles of the transfer function for the circuit in FIG. 10*a* can be calculated, for example, from the equivalent circuit for small signals, as shown in FIG. 10*b*, in the instance of an inverting external feedback. The scheme does not take into consideration poles at a higher frequency.

In the simplified circuit diagram, V2 is the voltage present at the intermediate node S, i.e. at the gate of $Tg_{mo}$, and the transistor Tc is generally shown as a unity gain block. Also shown is the load resistance $r_o$ applied to the output terminal OUT.

The main poles of the open-loop transfer function are determined by the following relations:

$$p1'_{ol}(M')=-1/r_o C_L \text{ and}$$

$$p2'_{ol}(M')=-1/r_i(C_C+C_P).$$

From the diagram in FIG. 10*b* the poles for the closed-loop transfer function can be found for an inverting feedback, with due approximation, as follows:

$$p1'_{cl-inv}(M')=-g_{mi}/C_C \text{ and}$$

$$p2'_{cl-inv}(M')=-\beta g_{mo}C_C C_L *(C_C+C_P)$$

where β is the splitting value of the input resistance Ri/(Ri+Rf).

The dependence of the pole locations on the gain determined by the feedback applied will be later analyzed in greater detail.

A second preferential Embodiment of an amplifier according to the invention will be described with reference to FIG. 11*a*, wherein Ahuja's compensation is used. The figure also shows a feedback circuit of the non-inverting type in that embodiment.

The compensation capacitor $C_C$ has, like in the previous embodiment, a second terminal coupled to the first input terminal IN− of the amplifier through the transistor Tc which serves the same function as in the case previously described. The coupling transistor Tc is connected into a source-follower configuration in this example too.

But unlike the circuit of FIG. 10a, the compensation capacitor $C_C$ has here the first terminal connected to a node, denoted by B in the figure, which is held at a constant voltage for the signal. Between the node B and the intermediate node S, a preferably PMOS transistor TB is connected which has its source terminal connected to the node B and to a first current generator $I_{P2}$, and its drain terminal connected to the intermediate node S to which a second identical current generator $I_{P2}$ is also connected. The gate terminal of TB is applied a predetermined constant voltage VB which has been generated outside the circuit but inside the device, if an integrated one. In the light of the construction of the current generators, it is found that the potential VB differs from VDD by an amount 1Vth+2Vsat which may be on the order of 1.5 volts and where Vth is a threshold voltage and Vsat is a saturation voltage.

Thus, the voltage at the node B will be constant because equal to the voltage VB but for the gate-source voltage of the transistor TB. This ensures a stable voltage at that node. Advantageously, the potential difference across the compensation capacitor is only dependent, therefore, on the voltage present at the input terminal IN−.

Figure 11A:
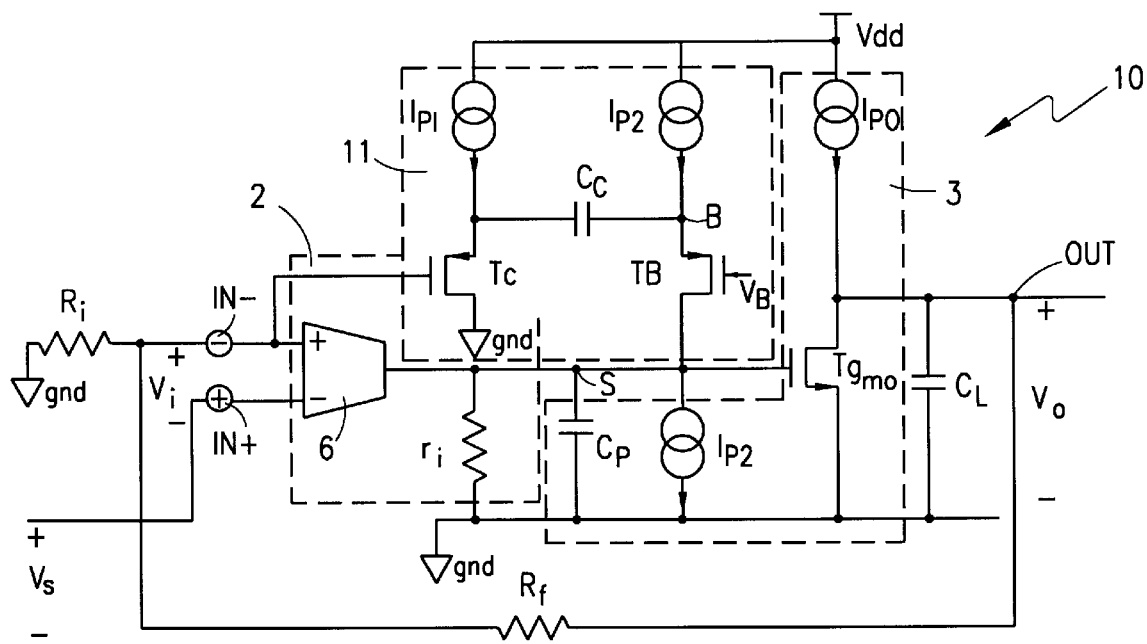
FIGS. 11a and 11b show a second embodiment of the invention using Ahuja's compensation and its circuit diagram for small signals, respectively.

The operation of the fed-back amplifier of FIG. 11a is similar to that of the amplifier of FIG. 10a.

Figure 11B:
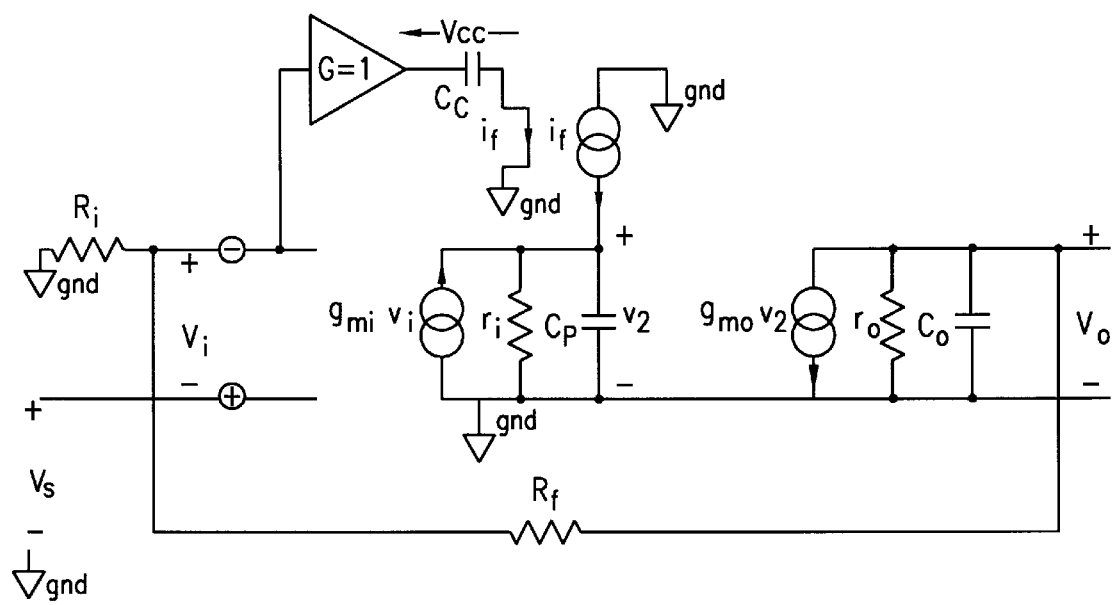

From an analysis of the frequency response it is found, in this case, that for a given feedback, the non-dominant pole of the open-loop transfer function is shifted toward higher frequencies, compared to the Miller's compensation construction. For the purpose, a circuit for small signals is shown in FIG. 11b which corresponds to the circuit in FIG. 11a, in a non-inverting feedback.

In this case, the open-loop poles are given by:

$p1'_{ol}(A') = -1/r_i C_P$ and $p2'_{ol}(A') = -1/r_o C_L$.

The poles for the closed-loop transfer function are shown here for both an inverting and a non-inverting feedback, with the latter having no zeros.

$p1'_{cl-inv}(A') = -g_{mi}/C_C$ like in the previous example, and $p2'_{cl-inv}(A') = -\beta g_{mo} C_C/C_L C_P$.

This second embodiment of the Ahuja type is advantageous particularly where the feedback is connected into a non-inverting configuration. In that case, the self-compensating effect is specially effective.

Simulations carried out for the circuit arrangement shown in FIG. 11a are illustrated by the following figures.

Figure 12:
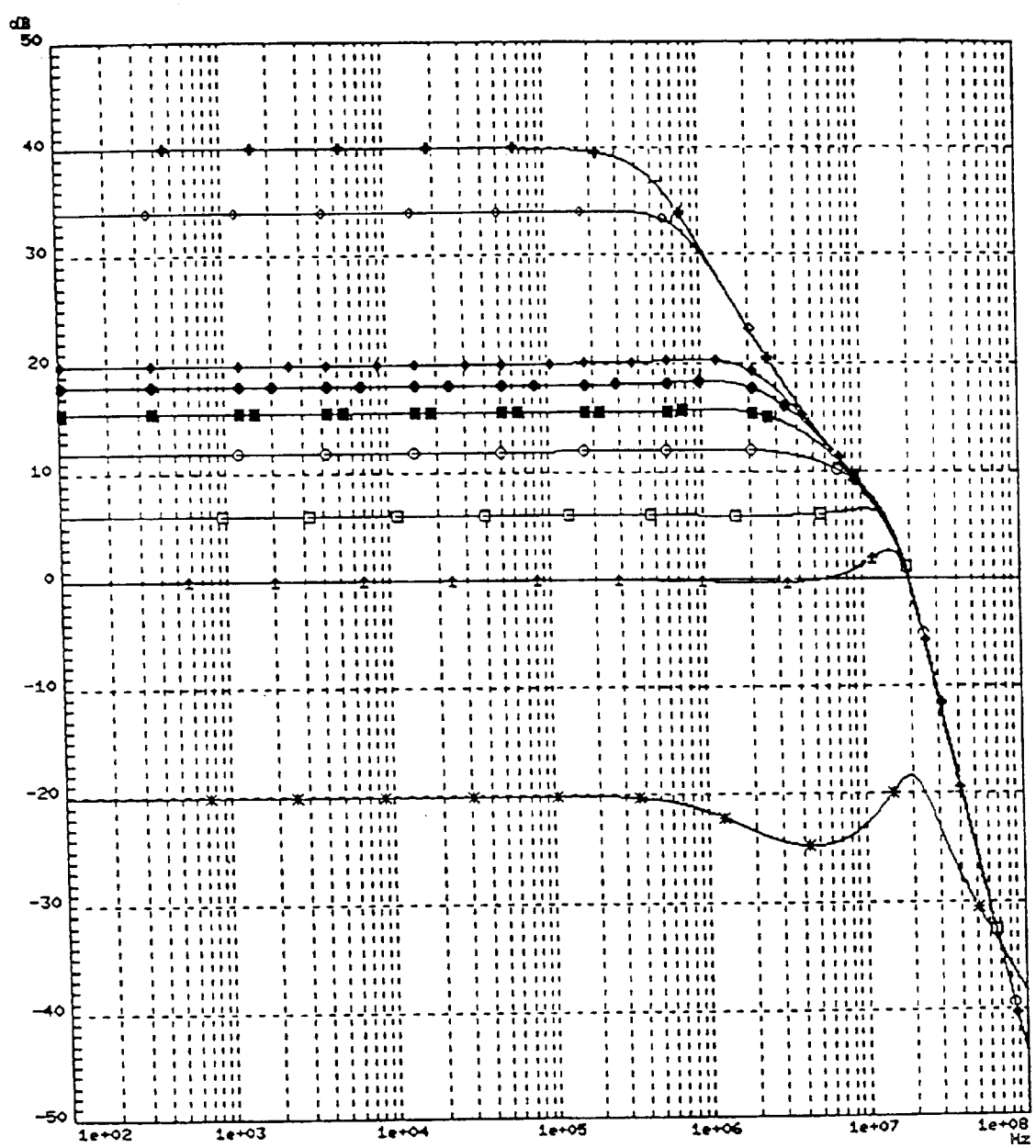
FIGS. 12 and 13 show the results of simulations of the AC type for a fed-back operational amplifier according to the invention, in inverting and non-inverting configurations, respectively.
Figure 13:
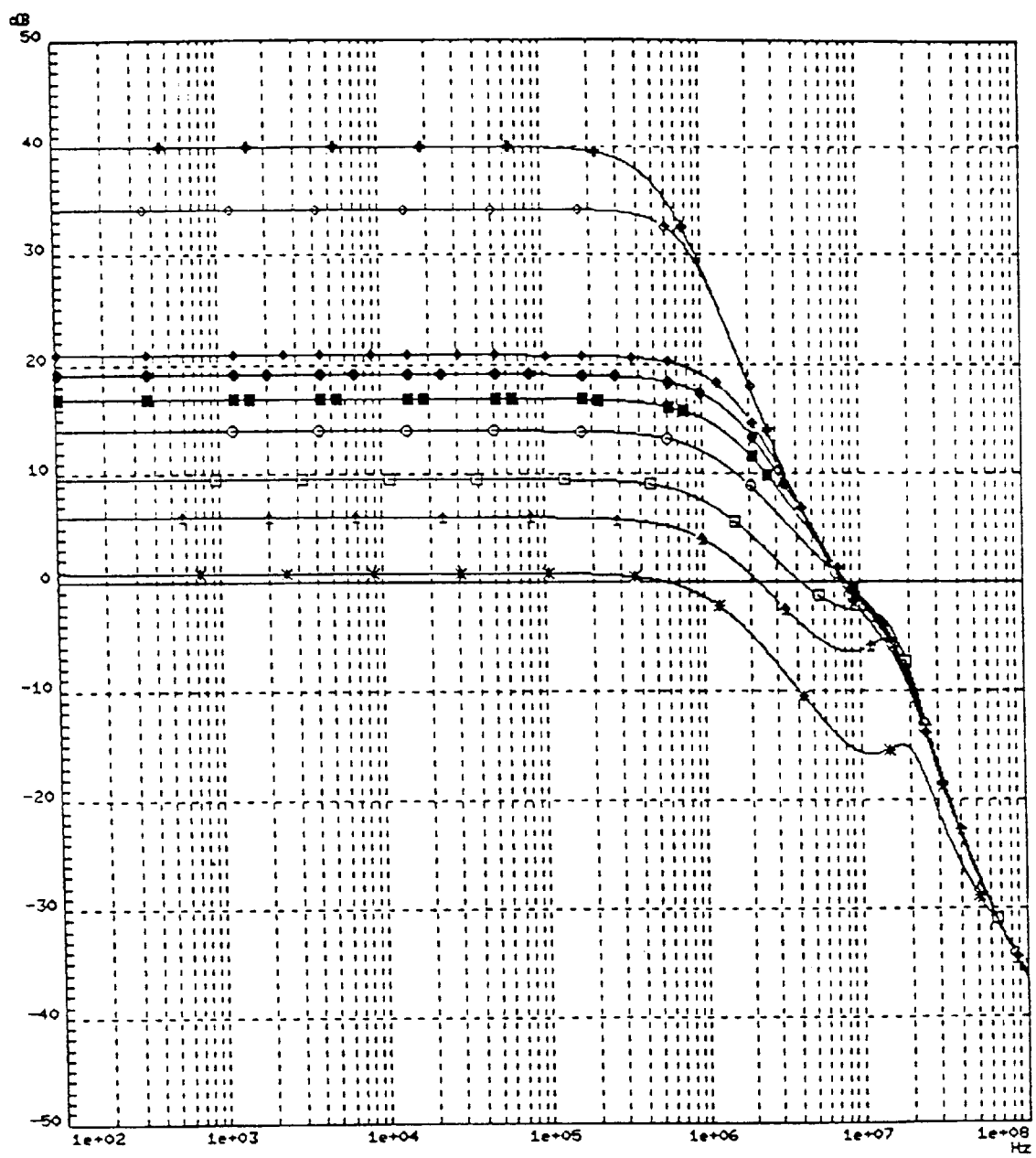

Simulations of the AC type are shown in FIGS. 12 and 13 for an inverting and a non-inverting feedback, respectively. Shown in the figures are the closed-loop Functions versus frequency for different values of feedback resistance or closed-loop gain. It can be seen that, in the non-inverting instance, the cutoff frequency of the former is particularly independent of the gain value selected.

Figure 14:
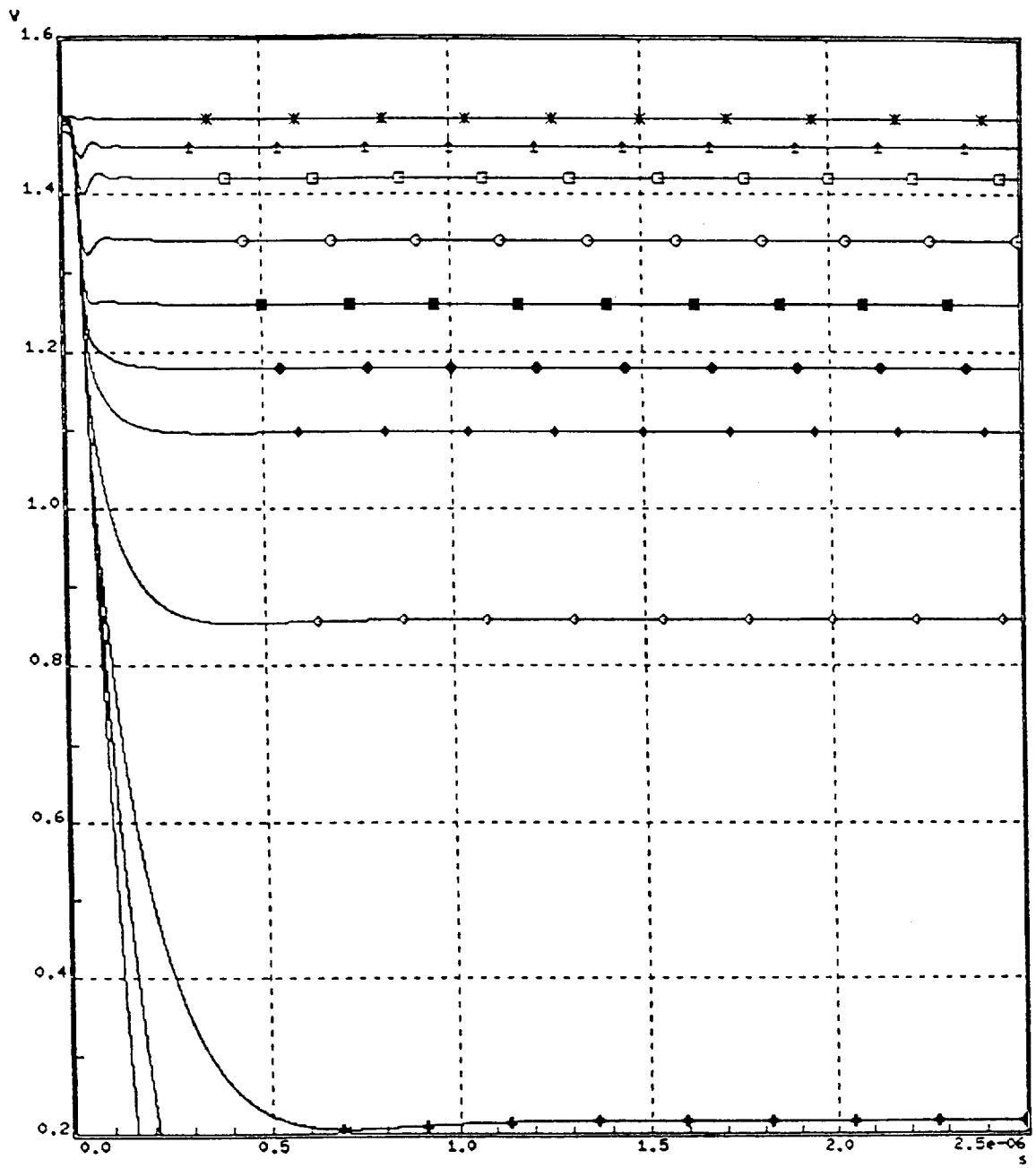
FIGS. 14 and 15 illustrate the behavior during the response transient to a step input of the fed-back amplifier in the inverting configuration, whereas in FIGS. 16 and 17, the feedback is non-inverting.
Figure 15:
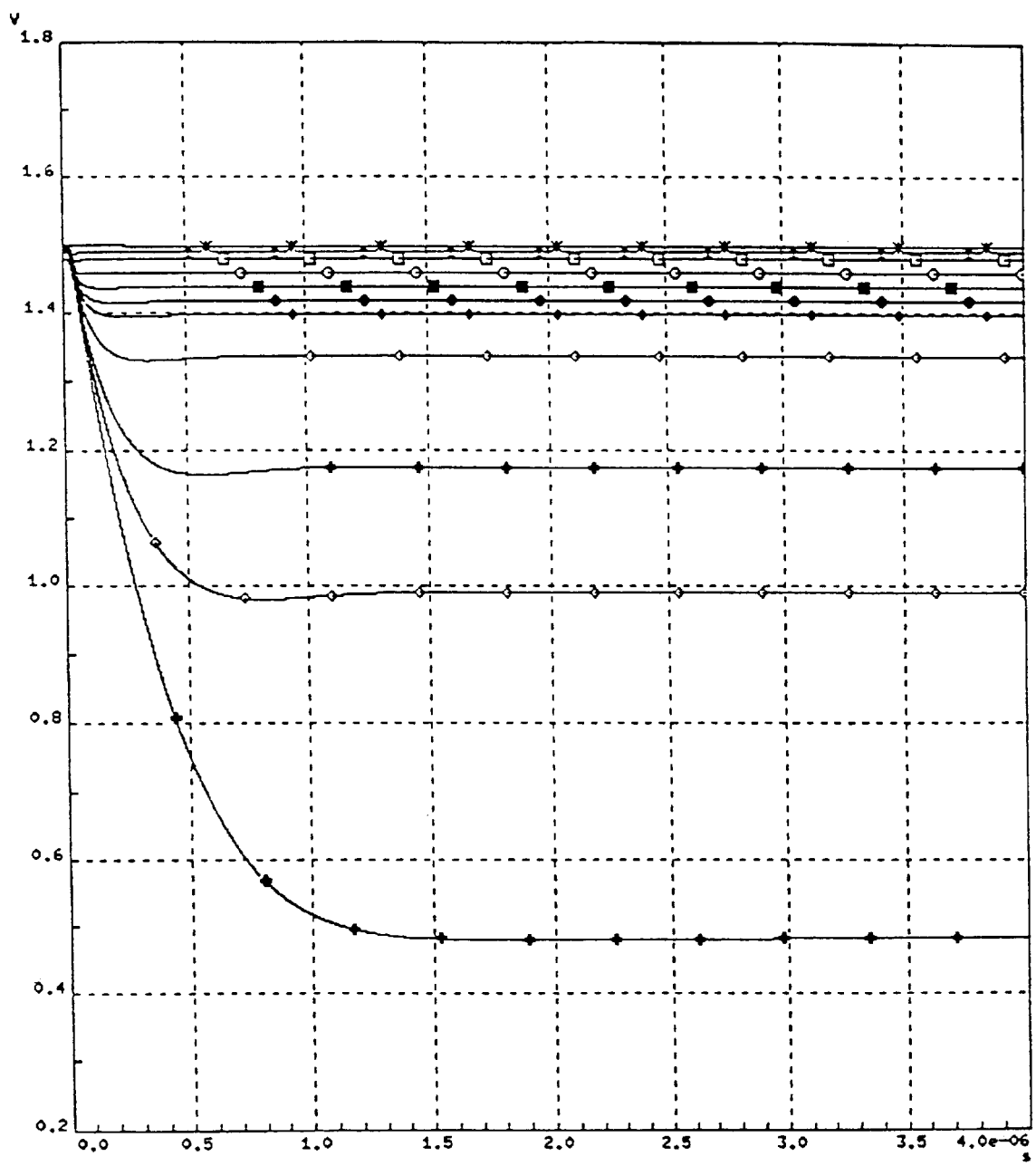
Figure 16:
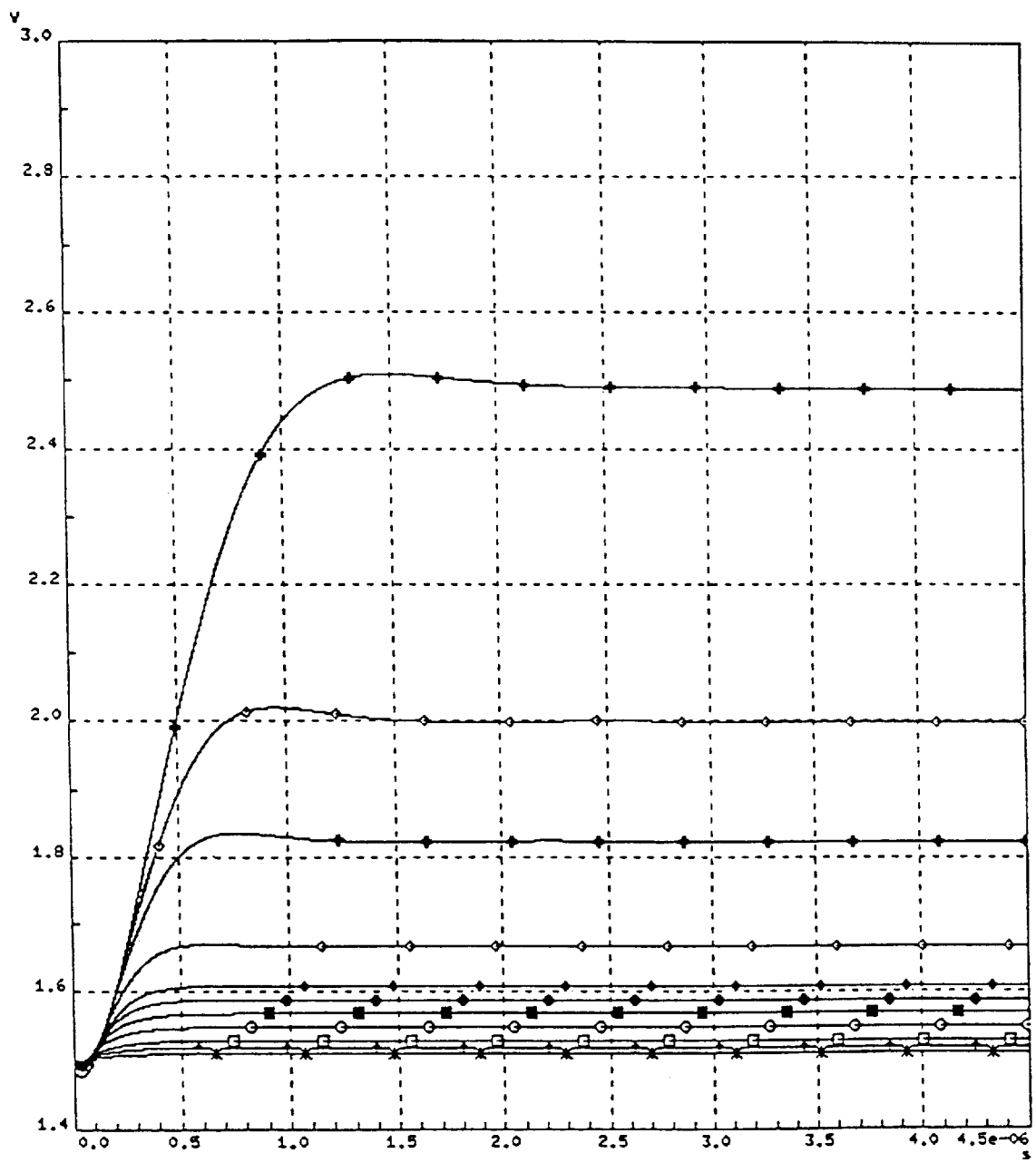
Figure 17:
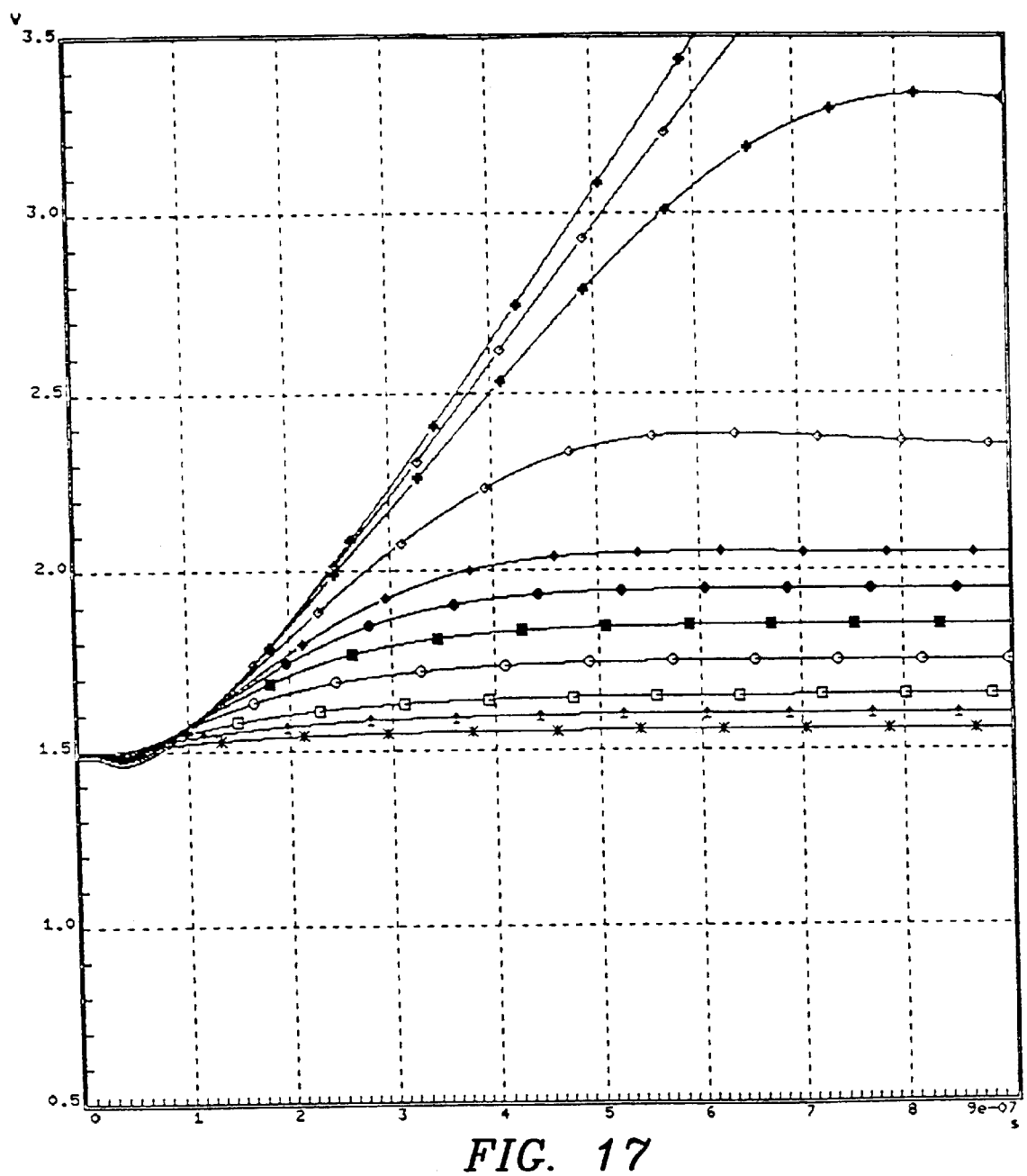

FIGS. 14 and 15 illustrate behaviors during the transient phase of response to an input signal with the so-called step shape, for the inverting configuration. The voltage at the output node OUT is plotted versus time. FIGS. 16 and 17 illustrate corresponding patterns for a non-inverting feedback. It can be seen that, in the non-inverting case, the speed of response is substantially independent of the gain selected.

As can be gathered from the two embodiments just described, the potential drop across the compensation capacitor $C_C$ is a fraction, dependent on feedback, of the output voltage Vo, whereas in the prior art embodiments described, one end is applied the full output voltage.

Figure 18:
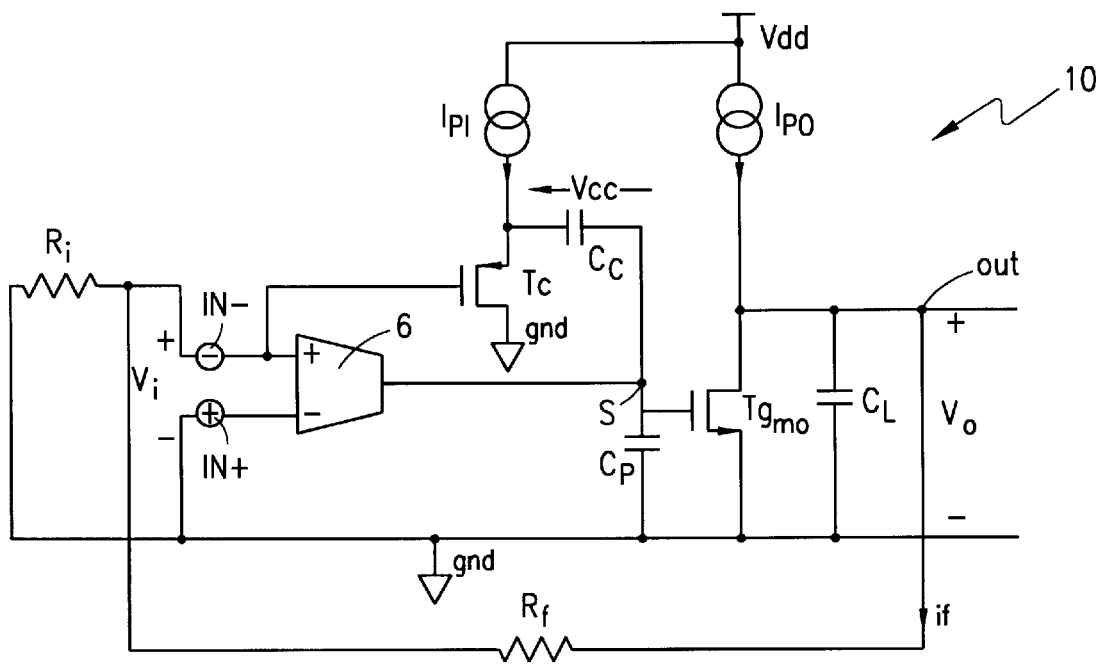
FIG. 18 shows the first embodiment with shorted inputs of the fed-back amplifier.

To illustrate the aforesaid behavior, FIG. 18 shows, by way of example, the first embodiment wherein the two inputs of the fed-back system have been shorted. As shown in the figure, the value of the current If flowing through the external feedback circuit is If=Vo/(Ri+Rf). Accordingly, the following relations hold for the voltage Vcc across $C_C$:

Vcc=$Ri*If=(Ri/(Ri+Rf))*Vo=\beta Vo$ where $\beta$=Ri/(Ri+Rf)<1. Therefore, the voltage Vcc is not constant and equal to Vo, but always lower than Vo. The voltage across the compensation capacitor is tied to the value of the external feedback, it being proportional to $\beta$, that is to the splitting value of the resistance Ri on the input with respect to the resistance applied on the feedback network Rf.

The feedback-variable compensation effect is obtained by altering the voltage applied to the compensation capacitor.

Thus, the extent of the feedback will determine the extent of the frequency compensation. Specifically, the compensation signal Sc, shown in FIGS. 9a and 9b, may vary with the closed-loop gain $G_{cl}$ as determined by the feedback circuit outside the amplifier and being $G_{cl}$=Rf/Ri.

Figure 19:
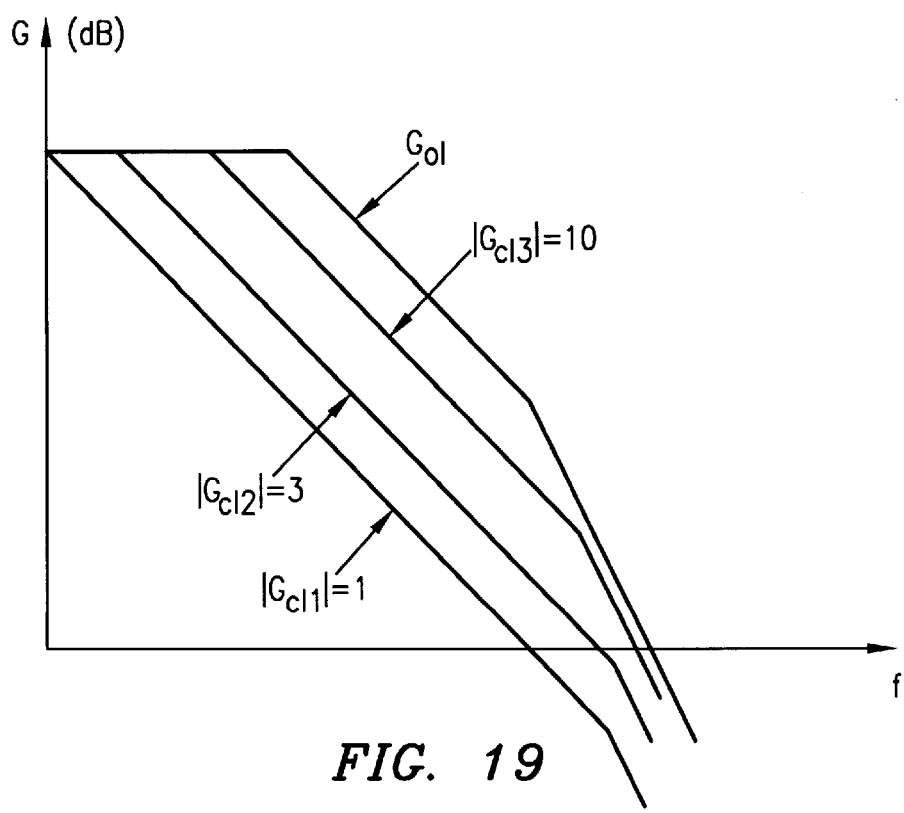
FIG. 19 illustrates the adaptive effect with gain of the compensation according to the invention.

Preferably, the variation of the compensation signal occurs in a relation of inverse proportionality to the closed-loop gain value. This provides a variable compensation as shown in FIG. 19.

Shown are the open-loop functions both for the instance, designated $G_{ol}$, of absent feedback and for the application of certain different feedbacks, which can be identified by the corresponding closed-loop gain value $G_{cl}$. The open-loop gain functions that correspond to three different feedbacks for gain values $G_{cl1}$, $G_{cl2}$ and $G_{cl3}$ on a log scale and in absolute value equal to 1, 3 and 10, respectively, are shown for comparative purposes.

It can be seen that where a feedback circuit has been applied to the amplifier, a shift has occurred in both main poles of the open-loop gain function relative to the open-loop case, i.e. with a feedback resistance of infinite, which is larger the lower is the closed-loop gain. In other words, where the gain selected by the feedback is low, compensation is high. An extreme case would be where no resistance is applied to the feedback, that is the output is shorted to the input, as is the case with the follower. In that case, the gain is zero and compensation at a maximum. Although the pass band is relatively small, stable operation is ensured for the fed-back amplifier. By contrast, with a high gain, extreme with the open loop, there would be little compensation. This allows a very high compensation band to be maintained, and therefore, the aforementioned problems of the prior art overcome. Thus, a sufficient bandwidth can be ensured for each feedback selected. This advantageously affords a high rate of frequency response by the amplifier under any operating conditions.

Therefore, the compensation block 11 generates a small compensation signal with a high closed-loop gain, and a high signal with a low gain feedback. This behavior may be regarded as a gain-adaptive form of pole splitting.

A method is also provided for frequency compensating an operational amplifier adaptively with respect to the closed-loop gain $G_{cl}$. Referring to the functional diagrams of FIGS. 9a and 9b, the method comprises the following steps:

placing an input stage 2 and output stage 3 in series with each other to receive an input signal $S_{in}$ on an input terminal IN and generate an amplified signal $S_{out}$ on an output terminal OUT;

placing an internal compensation block 11 generating a compensation signal Sc on a summing node S intermediate said stages 2 and 3;

operating a feedback path including a feedback block 5, between the output terminal OUT and the input terminal IN to generate a feedback signal Sf on the latter.

In a preferred embodiment, the method further comprises a step of applying the feedback signal Sf to the compensation block 11.

In a preferred embodiment, the compensation signal Sc varies with the closed-loop gain value $G_{cl}$, being tied to the block 5 in the feedback path. The variation of the compensation signal Sc is an inverse function of the gain value $G_{cl}$.

A frequency self-compensating effect is thus obtained with respect to closed-loop gain which advantageously requires no external control intervention on the amplifier from the user, for example.

The solution according to this invention is uniquely simple and does not involve the addition of any large number of internal circuit elements to the amplifier construction.

Also, no external components, e.g. in a variable gain system, are needed for the compensation. This advantageously avoids the need to use critical areas of the high-impedance circuit, such as the intermediate node S, as external terminals for connecting the compensation block. In this way, objectionable noise problems can be obviated.

Within the scope of this invention, the operational amplifier could include a further amplifier power stage connected between the gain output stage and the output terminal.

It will be appreciated that many changes and modifications may be made unto the operational amplifier, frequency self-compensated with respect to closed-loop gain, described above within the scope of the invention as defined in the following claims.

According to a disclosed class of innovative embodiments, there is provided: An operational amplifier, comprising: a transconductor stage and an amplifier stage connected in series; a compensation stage connected in parallel with said transconductor stage; and a feedback stage connected in parallel with said transconductor stage and said amplifier stage; wherein said operational amplifier is frequency self-compensated according to the closed-loop gain of the amplifier.

According to another disclosed class of innovative embodiments, there is provided an operational amplifier, comprising a transconductor stage having first and second input terminals and an output; an output transistor connected between first and second output terminals and having its control terminal connected to said output of said transconductor stage; a first current generator connected to drive said output transistor; a compensation circuit connected to said first input terminal and said output of said transconductor stage; wherein said operational amplifier is frequency self-compensated according to the closed-loop gain of the amplifier.

According to another disclosed class of innovative embodiments, there is provided a frequency self-compensated operational amplifier with respect to closed-loop gain, of the type which comprises a transconductance input stage and an amplifier output stage connected serially together to receive an input signal on at least one input terminal of the amplifier and generate an amplified signal on an output terminal of the amplifier, between said input and output stages there being provided an intermediate node which is connected to a compensation block to receive a frequency-variable compensation signal therefrom, characterized in that said compensation block is input coupled to said input terminal of the amplifier.

According to another disclosed class of innovative embodiments, there is provided a method for frequency compensating an operational amplifier adaptively with respect to closed-loop gain comprising the following steps: placing an input stage and output stage in series with each other to receive an input signal on an input terminal and generate an amplified signal on an output terminal placing an internal compensation block generating a compensation signal on a summing node intermediate said stages and 3); operating a feedback path including a feedback block between said output terminal and said input terminal to generate a feedback signal on the latter characterized in that it further comprises a step of applying said feedback signal to said compensation block.

The following background publications provide additional detail regarding possible implementations of the disclosed embodiments, and of modifications and variations thereof. All of these publications are hereby incorporated by reference: the ANALOG CIRCUIT DESIGN SEMINAR books published by Analog Devices; ANALOG CIRCUIT DESIGN (ed. J. Williams 1991); *Analog Dialogue* from 1980 to date; Collins, ANALOG ELECTRONICS HANDBOOK (1989); Coughlin and Driscoll, OP AMPS AND LINEAR INTEGRATED CIRCUITS 3.ed.(1991); Davidse, INTEGRATION OF ANALOGUE ELECTRONIC CIRCUITS; Feucht, HANDBOOK OF ANALOG CIRCUIT DESIGN (1990); Geiger et al., VLSI DESIGN TECHNIQUES FOR ANALOG AND DIGITAL CIRCUITS; Gray & Meyer, ANALYSIS & DESIGN OF ANALOG INTEGRATED CIRCUITS (2.ed. 1983 and 3.ed. 1993); Grebene, BIPOLAR & MOS ANALOG IC DESIGN (1984); Haskard and May, ANALOG VLSI DESIGN (1987); L. P. Huelsman, and P. E. Allen, INTRODUCTION TO THE THEORY AND DESIGN OF ACTIVE FILTERS (1980); Moschytz, LINEAR INTEGRATED NETWORKS: DESIGN (1975); Moschytz, LINEAR INTEGRATED NETWORKS: FUNDAMENTALS (1974); Pease, TROUBLESHOOTING ANALOG CIRCUITS; Schaumann et al., DESIGN OF ANALOG FILTERS (1990); J. Scott, ANALOG ELECTRONIC DESIGN (1991); Soclof, "Design and Applications of Analog Integrated Circuits"; Toumazou et al., ANALOGUE IC DESIGN: THE CURRENT-MODE APPROACH; Van Valkenburg, ANALOG FILTER DESIGN (1982); Thomas Young, LINEAR INTEGRATED CIRCUITS (1981).

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

For example, as will be obvious to those of ordinary skill in the art, other circuit elements wan be added to, or substituted into, the specific circuit topologies shown.

For another example, within the constraints well-known to those of ordinary skill, nonlinear devices can be added in series with (or used to replace) resistors, to increase the impedance of load devices.

What is claimed is:

1. An operational amplifier, comprising:
   a transconductor stage and an amplifier stage connected in series;
   a compensation stage connected in parallel with said transconductor stage; and a feedback stage connected in parallel with said transconductor stage and said amplifier stage and connected to said compensation stage and said transconductor stage such that said compensation stage receives input signals from said feedback stage and said transconductor stage;

wherein said operational amplifier is frequency self-compensated according to the closed-loop gain of the operational amplifier.

2. An operational amplifier, comprising:

a transconductor stage having first and second input terminals and an output;

an output transistor connected between first and second output terminals and having its control terminal connected to said output of said transconductor stage;

a first current generator connected to drive said output transistor;

a compensation circuit connected to said first input terminal and said output of said transconductor stage;

wherein said operational amplifier is frequency self-compensated according to the closed-loop gain of the operational amplifier.

3. The operational amplifier of claim 2, wherein said compensation circuit comprises a second current generator and a compensating capacitor.

4. The operational amplifier of claim 2, wherein said first output terminal is connected to said first input terminal of the said transconductor stage by a feedback network including a negative feedback circuit which generates a feedback signal.

5. The operational amplifier of claim 4, wherein said compensation block is connected to receive both said input signal and said feedback signal.

6. An operational amplifier, comprising:

a transconductance input stage;

an amplifier output stage connected serially to the transconductance stage, the serial combination of the transconductance input stage and the amplifier output stage receives an input signal on at least one input terminal of the operational amplifier and generates an amplified signal on an output terminal of the operational amplifier, between said input and output stages there being provided an intermediate node;

a compensation block to provide a frequency-variable compensation signal to the intermediate node, said compensation block being coupled to said input terminal of the amplifier such that said compensation signal is based upon an input signal and an external feedback generated signal provided to the input terminal of the operational amplifier.

7. An operational amplifier according to claim 6, wherein said output terminal is connected to said input terminal of the amplifier by a feedback network including a negative feedback circuit which generates the external feedback signal.

8. An operational amplifier according to claim 6, wherein said compensation block is connected to said input terminal of the operational amplifier so as to receive both said input signal and said external feedback signal at a single node.

9. A method for frequency compensating an operational amplifier used in analog application adaptively with respect to closed-loop gain comprising the following steps:

placing an input stage and output stage in series with each other to receive an input signal on an input terminal of the operational amplifier and generate an amplified signal on an output terminal thereof;

generating a compensation signal on a summing node intermediate said input and output stages;

generating a feedback signal on said input terminal for application to said internal compensation block, such that said compensation signal is based upon the feedback signal.

10. The operational amplifier of claim 1, wherein:

said compensation stage receives signals from said feedback stage and said transconductor stage from a common node.

11. The operational amplifier of claim 1, wherein:

said compensation stage generates a frequency-variable compensation signal to a node intermediate said transconductor stage and said amplifier stage.

12. The operational amplifier of claim 6, wherein:

said operational amplifier is frequency self compensated according to the closed loop gain of thereof.

* * * * *